US009093163B2

(12) United States Patent
Wunderlich et al.

(10) Patent No.: US 9,093,163 B2
(45) **Date of Patent: *Jul. 28, 2015**

(54) MAGNETORESISTIVE DEVICE

(75) Inventors: Joerg Wunderlich, Cambridge (GB); Jan Zemen, Chanovice (CZ); Claude Chappert, Garches (FR); Bryan Gallagher, Nottingham (GB); Thibaut Devolder, Massy (FR); David Williams, Cambridge (GB)

(73) Assignees: HITACHI, LTD., Tokyo (JP); UNIVERSITE PARIS SUD XI, Orsay (FR); CENTRE NATIONAL DE LA RECHERCHE SCIENTIFIQUE, Paris (FR)

( * ) Notice: Subject to any disclaimer, the term of this patent is extended or adjusted under 35 U.S.C. 154(b) by 670 days.

This patent is subject to a terminal disclaimer.

(21) Appl. No.: 12/687,550

(22) Filed: Jan. 14, 2010

(65) Prior Publication Data

US 2011/0170339 A1 Jul. 14, 2011

(51) Int. Cl.
*G11C 11/00* (2006.01)
*G11C 11/16* (2006.01)

(52) U.S. Cl.
CPC ............ *G11C 11/16* (2013.01); *G11C 11/1675* (2013.01)

(58) Field of Classification Search
USPC ......................... 365/158, 161, 163, 171, 173; 257/E27.006
See application file for complete search history.

(56) References Cited

U.S. PATENT DOCUMENTS

| | | | | |
|---|---|---|---|---|
| 6,387,476 | B1 | 5/2002 | Iwasaki et al. | |
| 6,483,741 | B1 | 11/2002 | Iwasaki et al. | |
| 8,138,758 | B2 * | 3/2012 | Wunderlich et al. | 324/252 |
| 2006/0002037 | A1 | 1/2006 | Zayets | |
| 2006/0133137 | A1 | 6/2006 | Shin et al. | |
| 2008/0068937 | A1 | 3/2008 | Ogawa et al. | |
| 2009/0016098 | A1 * | 1/2009 | Wunderlich et al. | 365/158 |
| 2009/0052237 | A1 * | 2/2009 | Morise et al. | 365/171 |
| 2009/0059659 | A1 * | 3/2009 | Inokuchi et al. | 365/171 |
| 2010/0080048 | A1 * | 4/2010 | Liu et al. | 365/157 |

FOREIGN PATENT DOCUMENTS

| | | | |
|---|---|---|---|
| EP | 1548702 | | 6/2005 |
| EP | 1705665 | | 9/2006 |
| EP | 1830410 | A1 | 9/2007 |
| EP | 2015307 | A1 * | 1/2009 |
| EP | 2015307 | A1 | 1/2009 |

(Continued)

OTHER PUBLICATIONS

Slonczewski, J.C., “Current-Driven Excitation of Magnetic Multilayers”; Journal of Magnetism and Magnetic Materials 159 (1966) L1-L7; Revised Oct. 27, 1995; revised Dec. 19, 1995.

(Continued)

*Primary Examiner* — Kretelia Graham
(74) *Attorney, Agent, or Firm* — Baker Botts L.L.P.

(57) ABSTRACT

A method of operating a magnetoresistive device is described. The device comprises a ferromagnetic region configured to exhibit magnetic anisotropy and to allow magnetisation thereof to be switched between at least first and second orientations and a gate capacitively coupled to the ferromagnetic region. The method comprises applying an electric field pulse to the ferromagnetic region so as to cause orientation of magnetic anisotropy to change for switching magnetisation between the first and second orientations.

7 Claims, 29 Drawing Sheets

(56) References Cited

FOREIGN PATENT DOCUMENTS

| | | |
|---|---|---|
| JP | 2005-011907 | 1/2005 |
| JP | 2005/123488 | 5/2005 |

OTHER PUBLICATIONS

Jeong, W.C., et al, Highly Scalable MRAM Using Field Assisted Current Induced Switching,; 2005 Symposium on VLSI Technology Digest of Papers, pp. 184-185.

DeVolder, T. et al, "Precharging Strategy to Accelerate Spin-Transfer Switching Below the Nanosecond," 2005 American Institute of Physics, Applied Physics Letter 86, 062505 (505), pp. 1-3.

DeVolder, T., et al, "Micromagnetic Simulation of Spin Transfer Torque Switching Combined With precessional Motion from a Hard Axis Magnetic Field," 2006 American Physics Letters 89, 252509, pp. 1-3.

Campion, R.P., et al, "High-Quality GaMnAs Films Grown With Arsenic Dimers," Journal of Crystal Growth, 247 (2003) 42-48.

Chiba, D., et al, "Electrical Manipulation of Magnetization Reversal in a Ferromagnetic Semiconductor," Science, vol. 301, Aug. 15, 2003, pp. 943-945.

Wunderlich, J., et al; "Coulomb blockade anisotropic magnetoresistance and voltage controlled magnetic switching in a ferromagnetic GaMnAs single electron transistor." Journal of Magnetism and Magnetic Materials, pp. 1883-1888m, vol. 310, No. 2., Mar. 16, 2007; *Elsevier Science Publishers*, Amsterdam, Netherlands.

* cited by examiner

MAGNETORESISTIVE DEVICE

FIELD OF THE INVENTION

The present invention relates to a magnetoresistive device.

BACKGROUND

Magnetic random access memory (MRAM) has several advantages over other types of non-volatile memory, such as Flash memory. For example, MRAM usually consumes less power and is faster to read and write data. MRAM also offers a promising alternative to some forms of volatile memory, such as dynamic random access memory (DRAM).

A conventional MRAM cell typically includes a magnetoresistive element which has a pair of ferromagnetic layers separated by a non-magnetic layer. One of the ferromagnetic layers has a relatively low coercivity and the other has a relatively high coercivity. The low- and high-coercivity layers are usually referred to as "free" and "pinned" layers respectively.

To store data in the cell, an external magnetic field is applied which orientates the magnetisation of the free layer. After the magnetic field is removed, the orientation of the magnetisation is retained.

To read data from the cell, a current is driven through the element. The magnetoresistance of the element is relatively high if the magnetisations of the layers are arranged in anti-parallel (AP) and is relatively low if the magnetisations of the layers are arranged in parallel (P). Thus, the state of the cell can be determined by measuring the magnetoresistance of the element.

The external magnetic field is generated by passing a current through at least one conductive line running close to the element. However, this arrangement suffers the problem that as the size of the cell decreases, the magnetic field required to switch the free layer increases and so power consumption also increases.

An alternative to applying an external magnetic field is to employ spin transfer switching, as proposed in "Current-driven Excitation of Magnetic Multilayers" by J. C. Slonczewski, p. 9353, Phys. Rev. B, Vol. 54 (1996), and reference is made to "Highly scalable MRAM using field assisted current induced switching" by W. C. Jeong et al., p. 184, 2005 Symposium on VLSI Technology Digest of Technical Papers.

In spin transfer switching, a current is driven through the magnetic element perpendicular to the layer interfaces. This causes spin-polarised electrons to be injected into the free layer either by electrons flowing through the pinned layer (when current is driven from the free layer to the pinned layer) or by electrons scattering from the pinned layer (when current is driven from the pinned layer to the free layer). When spin polarised electrons are injected into the free layer, they interact with the free layer and transfer a portion of their spin angular momentum to the magnetic moment of the free layer. If the spin-polarised current is sufficiently large, then this can cause the magnetisation of the free layer to switch.

A drawback, however, of spin transfer switching is that a high current density (e.g. of the order of $10^8$ $Acm^{-2}$) is needed to trigger the reversal process.

The current may be reduced by applying a dc pre-charging current before applying a switching current pulse, as described in "Precharging strategy to accelerate spin-transfer switching below the nanosecond" by T. Devolder et al., Applied Physics Letters, volume 86, page 062505 (2005). Although the power consumption of the switching current pulse is reduced, the overall power consumption (i.e. including the power consumption of the pre-charging current) is still quite large.

However, the current may be reduced by applying a short (e.g. <5 ns) external magnetic field pulse along a magnetic hard axis of the free layer immediately prior to or simultaneously with applying a switching current pulse so as to cause precessional switching, as described in "Micromagnetic simulation of spin transfer torque switching combined with precessional motion from a hard axis magnetic field" by K. Ito et al., Applied Physics Letters, volume 89, page 252509 (2006).

Although this technique can reduce the spin transfer current significantly, it involves applying an external magnetic field by passing a current through a line. This limits the potential for scalability and reducing power consumption.

The present invention seeks to ameliorate this problem.

SUMMARY OF THE INVENTION

According to a first aspect of the present invention there is provided an array of memory cells, each cell including a magnetoresistive device comprising a ferromagnetic region configured to exhibit magnetic anisotropy and to allow magnetisation thereof to be switched between at least first and second orientations; and circuitry for applying an electric field pulse to a ferromagnetic region of a magnetoresistive device in a memory cell so as to cause orientation of magnetic anisotropy to change for switching magnetisation between the first and second orientations.

According to a second aspect of the present invention there is provided an array of memory cells, each cell including a magnetoresistive device comprising a ferromagnetic region configured to exhibit magnetic anisotropy and to allow magnetisation thereof to be switched between at least first and second orientations and means for applying stress to the ferromagnetic region in response to an electrical input and means for supplying an input pulse to the stress-applying means in a memory cell so as to cause orientation of magnetic anisotropy of a corresponding ferromagnetic region to change for switching magnetisation between the first and second orientations.

The input pulse supplying means may comprise circuitry for applying an electrical input pulse, the ferromagnetic region is piezoelectric and the stress-applying means comprises at least one electrode configured to apply an electric field to the ferromagnetic region. The input supplying means may comprise circuitry for applying an electrical input pulse and the stress-applying means comprises a piezoelectric region coupled to the ferromagnetic region and at least one gate electrode configured to apply an electric field to the piezoelectric region. The input pulse supplying means may comprise means for supplying an optical input pulse and the stress-applying means comprises means for absorbing a pulse of light and generating a phonon pulse.

According to a third aspect of the present invention there is provided magnetoresistive device comprising a ferromagnetic region configured to exhibit magnetic anisotropy and to allow magnetisation thereof to be switched between at least first and second orientations and stress applying means coupled to the ferromagnetic region, wherein the stress-applying means is configured to absorb light and, in response to receiving an optical pulse, to generate a stress pulse so as to cause orientation of magnetic anisotropy of the ferromagnetic region to change for switching magnetisation between the first and second orientations.

The stress applying means may comprise a quantum well.

According to a fourth aspect of the present invention there is provided a method of operating a magnetoresistive device comprising a ferromagnetic region configured to exhibit magnetic anisotropy and to allow magnetisation thereof to be switched between at least first and second orientations, the method comprising applying an optical pulse so as to cause orientation of magnetic anisotropy of the ferromagnetic region to change for switching magnetisation between the first and second orientations.

The magnetoresistive device may comprise a photon absorption region coupled to the ferromagnetic region.

According to a fifth aspect of the present invention there is provided a magnetoresistive device comprising first and second electrodes, a ferromagnetic region and a tunnel barrier, the electrodes, ferromagnetic region and tunnel barrier arranged such that charge transport between the first and second electrodes occurs through the ferromagnetic region and tunnel barrier, the device further comprising a third electrode and a dielectric region disposed between the third electrode and the tunnel barrier, the first electrode and a dielectric region arranged so as to apply an electric field to the ferromagnetic region and wherein application of an electric field pulse to the ferromagnetic region causes orientation of magnetic anisotropy to change for switching magnetisation between the first and second orientations.

The tunnel barrier may be arranged as a layer having first and second faces and wherein the second electrode and the gate dielectric may be arranged adjacently on one of the faces. The ferromagnetic region may be arranged as a layer in a plane and may be configured such that an anisotropy field of the ferromagnetic region is switchable between being in plane and perpendicular.

According to a sixth aspect of the present invention there is provided a magnetoresistive device comprising a first ferromagnetic region exhibiting magnetic anisotropy in a first direction with a pinned magnetisation orientation, a second ferromagnetic region exhibiting magnetic anisotropy in a second, different direction; and a quantum well structure disposed between the first and second ferromagnetic regions and configured to exhibit at least one quantised energy state, wherein exchange coupling between the first and second ferromagnetic regions is controllable through the at least one quantised energy state.

The device may further comprise a third ferromagnetic region and a tunnel barrier separating the second and third ferromagnetic regions.

The device may further comprise means for applying a voltage bias between the first and second ferromagnetic regions.

According to a seventh aspect of the present invention there is provided a method of operating a magnetoresistive device comprising a ferromagnetic region configured to exhibit magnetic anisotropy and to allow magnetisation thereof to be switched between at least first and second orientations and a gate capacitively coupled to the ferromagnetic region, the method comprising applying an electric field pulse to the ferromagnetic region so as to cause orientation of magnetic anisotropy to change for switching magnetisation between the first and second orientations. Thus, precession-assisted magnetisation switching can be triggered using less power than a device having a conductive line for generating a magnetic field pulse.

The method may comprise exclusively applying the electric field pulse to the ferromagnetic region so as to cause magnetisation of the ferromagnetic region to switch between the first and second orientations. The method may comprise arranging for magnetisation of the ferromagnetic region to switch between the first and second orientations without applying a magnetic field pulse. Using only an electric field pulse to cause magnetisation of the ferromagnetic region to switch between the first and second orientations or not using a magnetic field pulse to assist switching helps to minimise power consumption.

The device may further comprise a conductive path running adjacent to the ferromagnetic region for generating a magnetic field pulse, the method further comprising applying a magnetic field pulse to the ferromagnetic region while applying the electric field pulse so to enhance the change orientation of effective magnetic field which comprises the anisotropy field which changes during the electric field pulse and the applied magnetic field pulse so as to switch the magnetisation between the first and second orientations. The method may comprise applying a leading edge of the electric field pulse before applying a leading edge of the magnetic field pulse.

The device may further comprise another ferromagnetic region having a higher coercivity than the ferromagnetic layer and separated therefrom by a tunnel barrier layer, the method further comprising applying a spin transfer current pulse passing through ferromagnetic regions while applying the electric field pulse so as to switch the magnetisation between the first and second orientations.

The method may further comprise applying a leading edge of the electric field pulse before applying a leading edge of the spin transfer current pulse. The ferromagnetic region may comprises a ferromagnetic semiconductor having an inhomogeneous strain distribution and the method comprises applying an electric field pulse of sufficient magnitude to vary distribution of charge carriers relative to the inhomogeneous strain distribution.

The inhomogeneous strain distribution comprises a region of compressive strain and a region of tensile strain. The ferromagnetic semiconductor may comprise (Ga,Mn)As.

The method may comprise applying an electric field pulse having a duration, t, which is a multiple of a quarter of $t_{precess}$ about:

$$t_{precess} = 1/f_{precess} = \frac{1}{\frac{\gamma}{2\pi}B_A}$$

where $\gamma$ is the gyromagnetic constant $\gamma = g\mu_B/\hbar$ ($2.2\times10^{15}$ $mA^{-1}s^{-1}$) and $B_A$ is the magnetic anisotropy field of the ferromagnetic semiconductor. The method may comprise applying a pulse having a duration, t, between 0 and 5 ns.

The method may further comprise applying a magnetic field to the ferromagnetic region independently of applying the electric field pulse so as to assist switching of the magnetisation of the ferromagnetic region between the first and second orientations.

The method may comprise applying stress to the ferromagnetic region and, while the stress is applied, applying the electric field pulse.

According to an eighth aspect of the present invention there is provided a method of operating a magnetoresistive device comprising a ferromagnetic region configured to exhibit magnetic anisotropy and to allow magnetisation thereof to be switched between at least first and second orientations, the method comprising applying a stress pulse to the ferromagnetic region so as to cause orientation of magnetic anisotropy to change for switching magnetisation between the first and second orientations. Thus, precessional or precession-assisted magnetisation switching can be triggered using less power than a device having a conductive line for generating a magnetic field pulse.

The device may comprise a piezoelectric region mechanically coupled to the ferromagnetic region and wherein applying the stress pulse comprises applying a voltage pulse across the piezoelectric region.

The method may comprise applying an electric field pulse to the ferromagnetic region while the stress pulse is applied to the ferromagnetic region.

According to ninth aspect of the present invention there is provided apparatus comprising a magnetoresistance device comprising a ferromagnetic region configured to exhibit magnetic anisotropy and to allow magnetisation thereof to be switched between at least first and second orientations and circuitry configured to operate the device according to the method.

According to a tenth aspect of the present invention there is provided a magnetoresistive device comprising a ferromagnetic region configured to exhibit magnetic anisotropy and to allow magnetisation thereof to be switched between at least first and second orientations, means for applying stress to the ferromagnetic region in response to a first electrical input and means for applying an electric field to the ferromagnetic region in response to a second electrical input.

The means for applying stress may comprise a piezoelectric region coupled to the ferromagnetic region and the means for applying an electric field may comprise at least one gate electrode.

BRIEF DESCRIPTION OF THE DRAWINGS

Embodiments of the present invention will now be described, by way of example, with reference to the accompanying drawings in which.

DETAILED DESCRIPTION OF CERTAIN EMBODIMENTS

Electric Field Pulse Induced Magnetization Reversal

Figure 1:
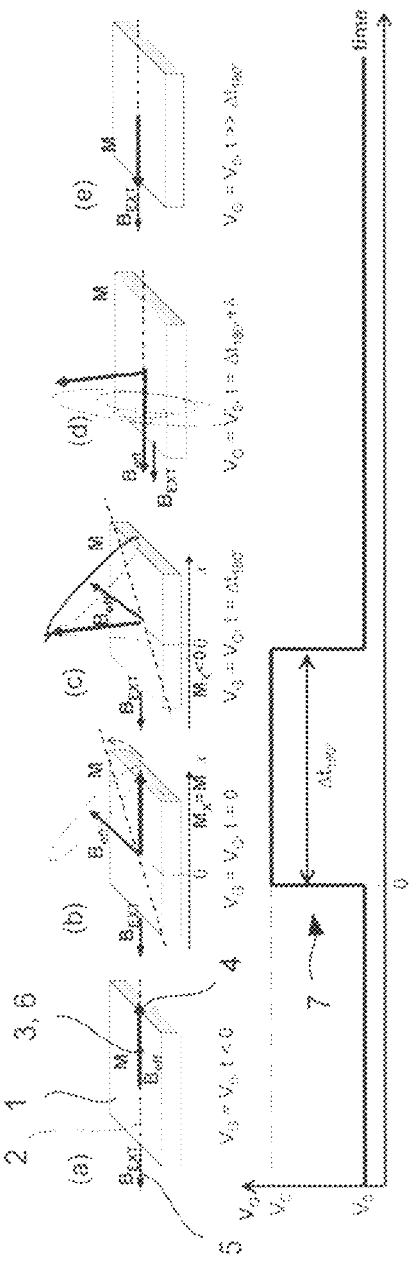
FIG. 1 illustrates applying an electric field pulse to a ferromagnetic element to cause a change in orientation of magnetic anisotropy and to switch magnetisation in accordance with the present invention.

Referring to FIG. 1, a ferromagnetic element 1 of a magnetoresistive device in accordance with the present invention is shown. The ferromagnetic element 1 is assumed to have homogenously distributed magnetization, although this need not necessarily be the case.

The ferromagnetic element 1 exhibits magnetic anisotropy defining a magnetic easy axis 2. Magnetic anisotropy may arise as a result of, inter alia, the shape of the element and/or crystal structure. For example, the element 1 may be elongate and so the magnetic easy axis 2 may be aligned along a longitudinal axis.

Magnetisation 4 of the element 1 is aligned along a magnetic easy axis 2.

An external magnetic field 5 may optionally be applied to support precessional switching and, depending on orientation, to stabilize re-orientation of the magnetisation 3. For example, the external magnetic field 5 may be applied globally to an array of ferromagnetic elements (of which the ferromagnetic element 1 is one). The external magnetic field 5 may be fixed along the hard axis to facilitate or assist the precessional switching, for example using a permanent magnet.

As shown in FIG. 1, the external magnetic field 5 is aligned anti-parallel to the initial magnetization along the easy axis 2 to stabilize re-orientation of the magnetisation 3. However, the external magnetic field 5 need not be aligned along the easy axis 2 and may be orientated at other angles including a hard axis which, for the arrangement shown in FIG. 1, is arranged perpendicular to the easy axis 2. The external magnetic field 5 may be variable and may be generated by passing a current through a conductive track (not shown).

The magnetic anisotropy field and the optional external magnetic field 5 result(s) in an effective magnetic field 6, namely:

$$\vec{B}_{eff}=\vec{B}_A+\vec{B} \quad (1)$$

where $\vec{B}_{eff}$ is the effective magnetic field 6 acting on the magnetization 3, $\vec{B}_A$ is the anisotropy field and $\vec{B}_{ext}$ is the external magnetic field 5 (expressed in vector notation).

As will now be explained, an electric field pulse 7 may be applied, for example perpendicularly to the plane of the layer, to change magnetic anisotropy in the ferromagnetic element 1 temporarily and trigger precessional reorientation of the magnetization 3.

Before the electric field pulse 7 is applied, in other words at $t<0$ and $V=V_0$ (e.g. $V_0=0$), where t is time and V is a bias applied to a gate (not shown), the magnetization 3 (shown as $\vec{M}$) is orientated in the direction of the effective magnetic field 6 (here designated as parallel to positive x-direction). In some embodiments, more than one gate (not shown) may be used.

An electric field pulse 7 is then applied, which causes magnetic anisotropy to change and, thus, the magnetization 3 to be rotated and to begin processing around the modified effective field.

Therefore, at the beginning of the pulse 7, i.e. at t=0 and $V=V_C$, the anisotropy field 2 changes causing the effective magnetic field 6 to rotate, i.e. $\vec{B}_{eff}^{+}(V_0)\rightarrow\vec{B}_{eff}(V_C)$, and the magnetization 3 starts damped precession around the axis of effective magnetic field 6, i.e. around $\vec{B}_{eff}(V_C)$.

Once the magnetisation 3 has carried out a half precession, the electric field 7 can be switched off. The magnetisation 3 then begins to stabilize (anti-parallel) along the easy axis 2.

Therefore, at the end of the pulse 7, when $t=\Delta t_{180°}$ and $V=V_C$, the anisotropy field and the effective magnetic field 6 have acquired a negative x-component, as shown in FIG. 1*c*.

Shortly after the pulse 7 has ended, when $t=\Delta t_{180°}+\delta$ (where $\delta>0$) and $V_G=V_0$, the anisotropy field 2 has reversed and is aligned anti-parallel to its original orientation, i.e. $\vec{B}_{eff}(V_C)\rightarrow\vec{B}_{eff}^{-}(V_0)$, parallel −x-direction and the magnetisation 3 continues damped precession around the axis of effective magnetic field 6, i.e. around $\vec{B}_{eff}^{-}(V_0)$.

When $t \gg \Delta t_{180°}$ and $V_G=V_0$, the magnetisation 3 reaches equilibrium and is aligned along the effective magnetic field, which is parallel (−x)-direction, i.e. $\vec{B}_{eff}^{-}(V_0)$.

Magnetisation reversal may be understood by considering orientation-dependent energy of magnetization 3. For example, for $V_0$, the easy axis 2 along the x-axis corresponds to two energy minima divided by a potential barrier. The height of the barrier corresponds to the energy increase if the magnetization 3 is aligned along the hard axis.

Magnetization reversal, i.e. reorientation of magnetization by 180°, can be used in a tunnelling magnetoresistance (TMR) device, gigantic magnetoresistance (GMR) device and other similar types of read device where the relative orientation between the switched layer and a fixed reference layer determine the resistance of the device.

If the gate voltage pulse 7 results in a new easy axis which is rotated from the original easy axis 4 by more than 45° and up to 90°, then magnetization reversal can be achieved without using an assist magnetic field.

This can be achieved in $Ga_{1-x}Mn_xAs$ at high carrier density, for example when x>0.03, for example, by spatially varying strain within the element 1 from a location in which it is in tensile strain, in which anisotropy is orientated perpendicular to the plane of the layer, to a location in which it is in compressive strain, in which magnetic anisotropy is orientated in the plane of the layer. Rotation of easy axis can also be achieved by changing the carrier density in a strained configuration.

In low doped $Ga_{1-x}Mn_xAs$, where x<0.02, magnetic anisotropy variation can behave in an opposite way. For example, in a location in which the element is compressively strained, magnetic anisotropy may be orientated perpendicularly to the plane and in a location in which the element is in tensile strain, the magnetic anisotropy is orientated in plane Depending on the particular magnetic anisotropy of the system, a complete magnetisation reversal is not necessary, in other words magnetisation need not be re-orientated by 180°. For example, magnetization reorientation of 90° can be achieved in an element exhibiting cubic magnetic anisotropy, if the easy axis rotates by an angle less than or equal to 22.5° with a longer pulse length (e.g. a half precession pulse) or at larger angles up to 90° for a shorter pulse lengths (e.g. a quarter precession pulse). This can occur in such as we have observed in $Ga_{1-x}Mn_xAs$ having very small strain variations resulting from changes in lattice constant of the order of ~0.01%. In this case, also anisotropic magnetoresistance effects, such as anisotropic magnetoresistance (AMR), tunnelling anisotropic magnetoresistance (TAMR) or Coulomb blockade anisotropic magnetoresistance (CBAMR) can be used to read out the magnetization orientation.

Local Control of Magnetocrystalline Anisotropy in (Ga,Mn) as Devices

Figure 2:
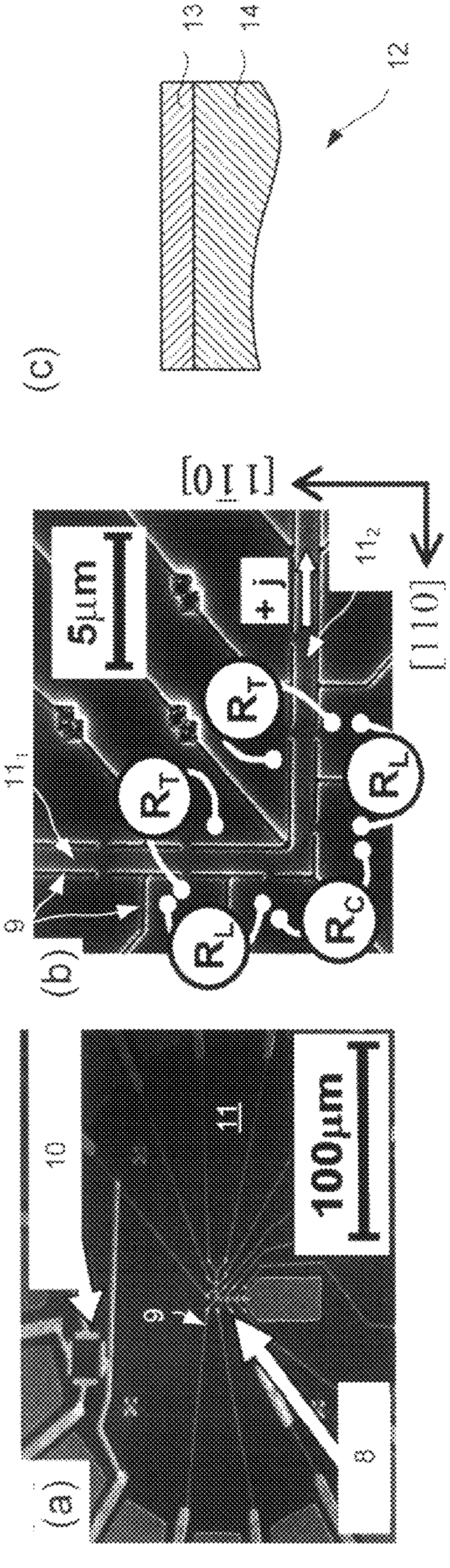
FIG. 2*a* is a scanning electron micrograph of a device in which orientation of magnetic anisotropy varies due to lithographically-induced strain relaxation and of a van der Pauw device without strain variation.
FIG. 2*b* is a magnified view of the device shown in FIG. 2*a;*
FIG. 2*c* is a cross-section of a layer structure from which the device and the van der Pauw device shown in FIG. 2*a* are fabricated.

FIGS. 2*a* and 2*b* illustrate a device 8 in which magnetocrystalline anisotropies are tuned and controlled using strain relaxation arising from lithographically-defined trenches 9. The magnetocrystalline anisotropies are induced by spin-orbit coupling. To aid characterisation of magnetic anisotropy of both bulk GaMnAs and the effect of strain relaxation in the device 8, a van der Pauw device 10 is defined in the wafer 11 adjacent to the device 8.

The device 8 is in the form of a Hall bar having a channel 11 which is 'L'-shaped in plan view and which includes first and second arms $\mathbf{11}_1$, $\mathbf{11}_2$ orthogonally aligned along the [110] and [1$\bar{1}$0] directions. The arms have a (transverse) width, w, of 1 μm and a (longitudinal) length, l, of 20 μm.

Referring in particular to FIG. 2*c*, the device 8 is formed in a wafer having a layer structure 12 comprising a $Ga_{0.95}Mn_{0.05}As$ epitaxially-grown layer 13 (or "epilayer) having a thickness of 25 nm grown along the [001] crystal axis on a GaAs substrate 14. The channel 11 is defined using electron beam lithography and reactive ion-beam etching. The trenches 9 have a (transverse) width, W, of 200 nm and a depth, d, of 70 nm.

Referring to FIGS. 3*a* to 3*d*, electrical characteristics for another device (not shown) having an identical configuration to the device 8 and for the device 8 are shown. The other device (not shown) and the device 8 differ in the dimensions of the Hall bars. In the other device (not shown), the arms (not shown) are 4 μm wide and 80 μm long. In the device 8 shown in FIGS. 2*a* and 2*b*, the arms $\mathbf{11}_1$, $\mathbf{11}_2$ are 1 μm wide and 20 μm long.

These devices 8 exhibit in-plane magnetocrystalline anisotropy and have a saturation magnetisation, $M_s$, of about 50 mT. This arises due to the effect of strain relaxation rather than shape anisotropy. For example, shape anisotropy fields for the devices 8 are less than 1 mT, which is one order of magnitude lower than the magnetocrystalline anisotropy fields. Thus, the easy axes are not defined by shape anisotropy, but rather than magnetocrystalline anisotropy.

A Curie temperature ($T_c$) of 100° K is estimated using Arrot plots of anomalous Hall data. A hole density of $5\times10^{20}$ $cm^{-3}$ is estimated from high-field Hall measurements. At this doping, compressive strain in the $Ga_{0.95}Mn_{0.05}As$ epilayer 13 grown on the GaAs substrate 15 produces a strong magnetocrystalline anisotropy which forces magnetization vector to align parallel with the plane of the magnetic epilayer 13.

Magnetization orientations in the individual microbar devices 8 are locally monitored by measuring longitudinal and transverse components of the anisotropic magnetoresistance (AMR) for in-plane rotating magnetic field (not shown).

Figure 3:
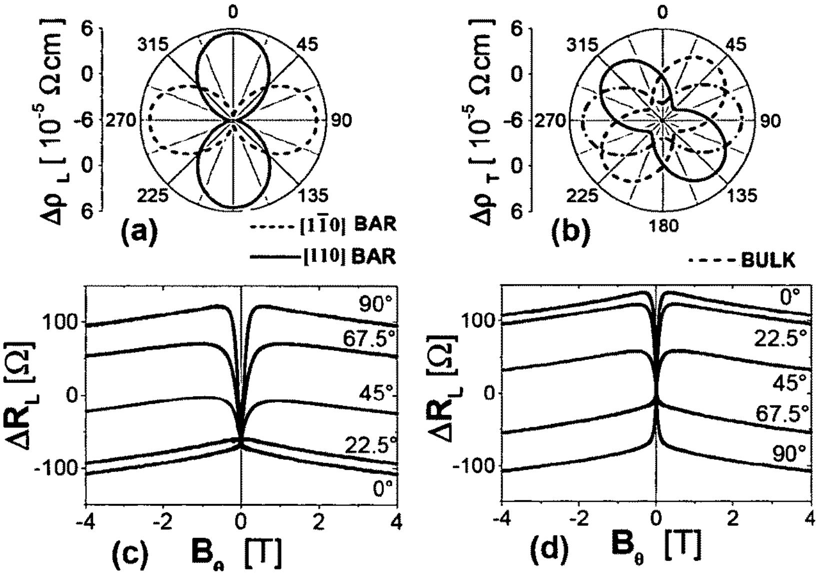
FIG. 3*a* shows of plots of longitudinal anisotropic magnetoresistance at 4.2° K for [1$\bar{1}$0]- and [110]-orientated arms of the device shown in FIG. 2*a* in a rotating magnetic field having a fixed magnetic field magnitude (B=4T) with angles measured from the [110]-axis.
FIG. 3*b* shows plots of transverse magnetoresistance at 4.2° K for [1$\bar{1}$0] and [110] arms for the device shown in FIG. 2*a* and also for the van der Pauw device shown in FIG. 2*a* in a rotating magnetic field having a fixed magnetic field magnitude (B=4T) with angles measured from the [110] axis.
FIG. 3*c* shows plots of longitudinal anisotropic magnetoresistance at 4.2° K for [110] orientated arm of a device similar to that shown in FIG. 2*a* but having a wider and longer channel in a varying magnetic field in at different angle.
FIG. 3*d* shows plots of longitudinal anisotropic magnetoresistance at 4.2° K for [110] orientated arm of the device shown in FIG. 2*a* in a fixed-angle varying magnetic field.

FIGS. 3*a* and 3*b* illustrate magnetization rotation plots at saturation magnetic field which show that the in-plane AMRs closely follow the form:

$$\Delta\rho_L = A\cos(2\phi) \tag{2a}$$

$$\Delta\rho_T = A\sin(2\phi) \tag{2b}$$

where $\rho_L$ is longitudinal resistivity, $\rho_T$ is transverse resistivity, A is a constant (not only for each Hall bar, but also for the van der Pauw device 10) and φ is an angle between magnetization and current. $\Delta\rho_{L,T}=\rho_{L,T}-\bar{\rho}_{L,T}$, where $\bar{\rho}_{L,T}$ is the average over all angles.

FIGS. 3*c* and 3*d* show magnetoresistance plots for external magnetic field sweeps in which a field angle, θ, measured from the [1$\bar{1}$0] axis, is constant.

As shown, magnetoresistance is strongly dependent at the values of θ and is attributed to magnetization rotations. At high fields, the magnetoresistance becomes purely isotropic, i.e. the differences between resistances for different angles θ become independent of the magnitude of the external field. This property and the much smaller magnitude of the isotropic magnetoresistance compared to the low-field anisotropic magnetoresistance enables the high-field measurements shown in FIGS. 3*a* and 3*b* to be used to determine a one-to-one correspondence between a change in the low-field resistance and a change in magnetization orientation. The 45° phase shift between the longitudinal and transverse AMR traces shown in FIGS. 3*a* and 3*b* can be used to determine a change in the magnetization angle if both resistance components are measured simultaneously.

Fixed θ magnetoresistance measurements can used first to determine local magnetic anisotropies in the individual microbars. Values of θ corresponding to easy-axis directions have the smallest magnetoresistance. For values of θ not corresponding to easy axis directions the magnetization undergoes a (partially) continuous rotation at low fields resulting in different orientations and, thus, different measured resistances, at saturation and remanence. Using this technique, the easy-axis directions can be determined to within ±1°.

Figure 4:
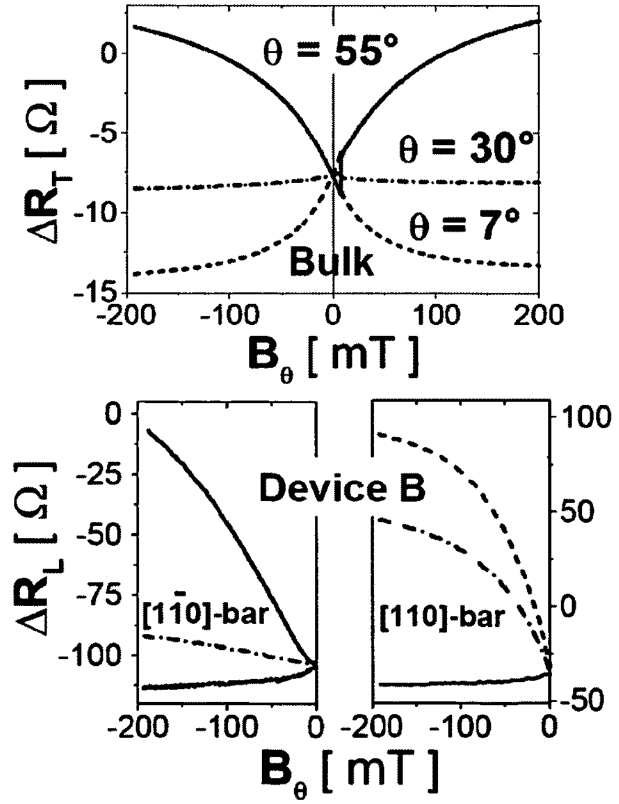
FIG. 4*a* shows plots of transverse resistance measurement at 4.2° K for the van der Pauw device shown in FIG. 2*a;*
FIG. 4*b* shows plots of transverse resistance measurement at 4.2° K for the device shown in FIG. 2*a;*

The effect of introducing spatial variation of strain on magnetic anisotropy is shown in FIGS. 4*a* and 4*b*.

In bulk material, measured using the van der Pauw device 10 (FIG. 2*a*), a magnetization angle 30° corresponds to an easy-axis, while 7° and 55° are significantly harder. However, in the device 8 shown in FIG. 2*a*, 7° is an easy axes in the [1$\bar{1}$0]-bar and 55° is an easy-axis in the [110]-bar.

Table 1 below lists easy axes found in the other device (not shown) labelled 'A', the device 8 labelled 'B' and in bulk material, i.e. in the van der Pauw device 10:

TABLE 1

| Sample | Bulk | A [1$\bar{1}$0] | A [110] | B [1$\bar{1}$0] | B[110] |
|---|---|---|---|---|---|
| Easy axis angle | ±30° | ±15° | ±36° | +7°, −8° | + 55°, −63° |

Bulk material has cubic anisotropy arising from the underlying zincblende structure, plus an additional uniaxial [1$\bar{1}$0] anisotropy arising from being an (Ga,Mn)As epilayer 13. This results in two easy axes tilted by 15± from the [100] and [010] cube edges towards the [1$\bar{1}$0] direction.

In the microdevices, i.e. the other device (not shown) and the device 8, the easy axes are rotated inwardly from the angles occupied in the bulk material towards the arms $\mathbf{11}_1$, $\mathbf{11}_2$. The degree of rotation increases as the width of the arms $\mathbf{11}_1$, $\mathbf{11}_2$ decreases.

The local changes in the magnetocrystalline anisotropy may be understood in the following way.

Referring again to FIG. 2*a*, $Ga_{0.95}Mn_{0.05}As$ epilayers 13 grown on GaAs substrate 15 are compressively strained in the (001) plane with the typical value of the strain parameter:

$$f \equiv \frac{(a_{GaMnAs} - a_{GaAs}}{a_{GaAs}} \tag{3}$$

where $\alpha_{GaAs}$ and $\alpha_{GaMnAs}$ are the lattice parameters of cubic, fully-relaxed GaAs and (Ga,Mn)As, respectively. Using equation (3) above and values of $\alpha_{GaAs}$ and $\alpha_{GaMnAs}$, f≈0.2-0.3

With (Ga,Mn)As material removed in the trenches 9 along the bars 11, the lattice can relax in a transverse direction and the corresponding extension can be roughly estimated as ft/w~0.01, where t is the thickness of the (Ga,Mn)As film, in this case 25 nm, and w is the bar width.

On a quantitative level, the strength of the lattice relaxation in the microbars can be obtained using numerical elastic theory simulations for the realistic sample geometry. GaAs values of the elastic constants are considered for the whole wafer including the $Ga_{0.95}Mn_{0.05}As$ epilayer 13.

Figure 5:
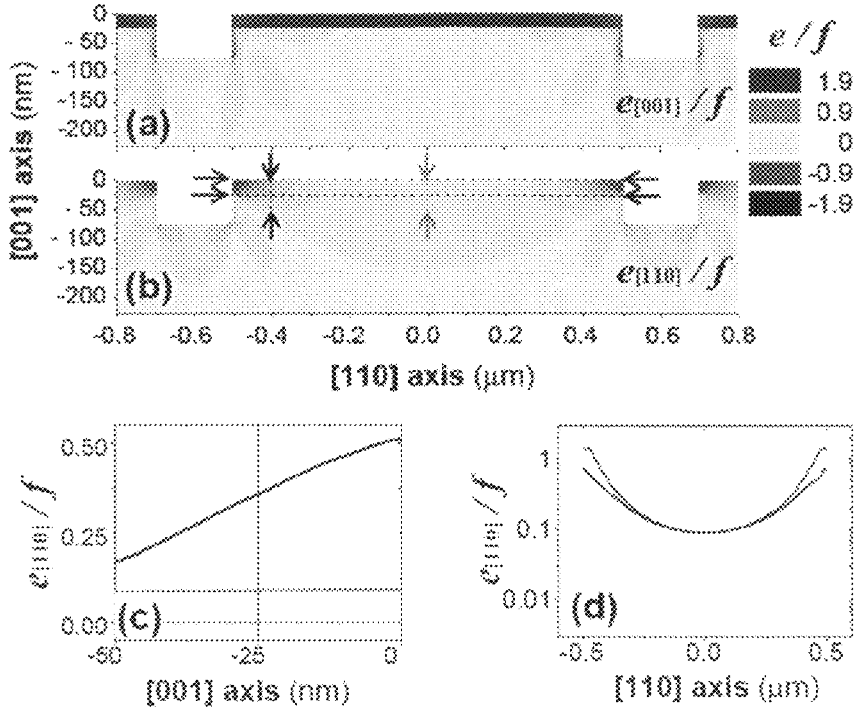
FIG. 5*a* shows a 2-dimensional plot of numerical simulated values of strain along an [001]-axis for a transverse cross section of the device shown in FIG. 2*a;*
FIG. 5*b* shows a plot of numerical simulated values of strain along an [110]-axis for a transverse cross section of the device shown in FIG. 2*a;*
FIG. 5*c* shows a plot of simulated values of strain a different cuts through the [001]-plane for the device shown in FIG. 2*a;*
FIG. 5*d* shows a plot of simulated values of strain a different cuts through the [110]-plane for the device shown in FIG. 2*a;*

Referring to FIG. 5, numerical simulations of strength of the lattice relaxation for the [1-10]-bar $\mathbf{11}_2$ of device 11 (FIG. 2*a*) are shown.

FIG. 5*a* shows the strain component along the growth-direction [001]-axis with respect to the lattice parameter of a fully relaxed cubic GaAs, namely:

$$e_{[001]}=(\alpha_{[001]}-\alpha_{GaAs})/\alpha_{GaAs} \tag{4}$$

Since strain components scale linearly with f, then $e_{[001]}/f$ can be plotted.

FIG. 5 illustrates growth-induced lattice matching strain. Because of in-plane compression of the (Ga,Mn)As lattice, the elastic medium reacts by expanding the lattice parameter in the growth direction, as compared to $\alpha_{GaAs}$, i.e. $e_{[001]}/f>1$.

Within the plane of the epilayer 13 the lattice can relax only in a direction perpendicular to the microbar orientation. The corresponding strain component, calculated again with respect to the GaAs, is plotted in FIG. 5*b* over the entire cross-section of device 11 and in FIGS. 5*c* and 5*d* along various cross sections through the [001]-[110] plane. While in the centre of the bar the in-plane relaxation is relatively weak, i.e. the lattice parameter remains similar to that of the GaAs substrate 15, the lattice is strongly relaxed near the edges of the bar 11. Averaged over the entire cross-section of the (Ga,Mn)As bar, relative in-plane lattice relaxation is found to be several hundredths of a percent, i.e. of the same order as estimated by the ft/w expression. Microscopic magnetocrystalline energy calculations described below confirm that these seemingly small lattice distortions can account for the observed easy-axis rotations in the strongly spin-orbit coupled (Ga,Mn)As.

Microscopic calculations of the magnetization angle dependent total energies are based on combining the six-band k.p description of the GaAs host valence band with kinetic-exchange model of the coupling to the local $Mn_{Ga}$ $d^5$-moments. The theory is well suited for the description of spin-orbit coupling phenomena in the top of the valence band whose spectral composition and related symmetries are dominated, as in the familiar GaAs host, by the p-orbitals of the As sub-lattice. The k.p modelling also provides straightforward means of accounting for the effects of lattice strains on the (Ga,Mn)As band structure. As in the above macroscopic simulations we assume that the elastic constants in (Ga,Mn)As have the same values as in GaAs. This theory, which uses no adjustable free parameters, has explained the observed transitions between in-plane and out-of-plane easy magnetization orientations in similar (Ga,Mn)As epilayers grown under compressive and tensile strains and provided a consistent account of the signs and magnitudes of corresponding AMR effects.

For the modelling of the magnetocrystalline energy of the microbars, homogeneous strain in the (Ga,Mn)As layer corresponding to the average value of $e_{[001]}$ obtained in the macroscopic simulations can be assumed. The input parameters of the microscopic calculations are strain components, related to the fully relaxed cubic (Ga,Mn)As lattice, in the [100]-[010]-[001] (x-y-z) coordinate system which are given by:

$$e_{ij} = \begin{pmatrix} e_{xx} & e_{xy} & 0 \\ e_{yx} & e_{yy} & 0 \\ 0 & 0 & e_{zz} \end{pmatrix} = \begin{pmatrix} e_{[110]}/2 - f & \pm e_{[110]}/2 & 0 \\ \pm e_{[110]}/2 & e_{[110]}/2 - f & 0 \\ 0 & 0 & e_{[001]/2-f} \end{pmatrix} \tag{5}$$

where ± corresponds to the [1$\bar{1}$0]-bar and [110]-bar respectively.

Figure 6:
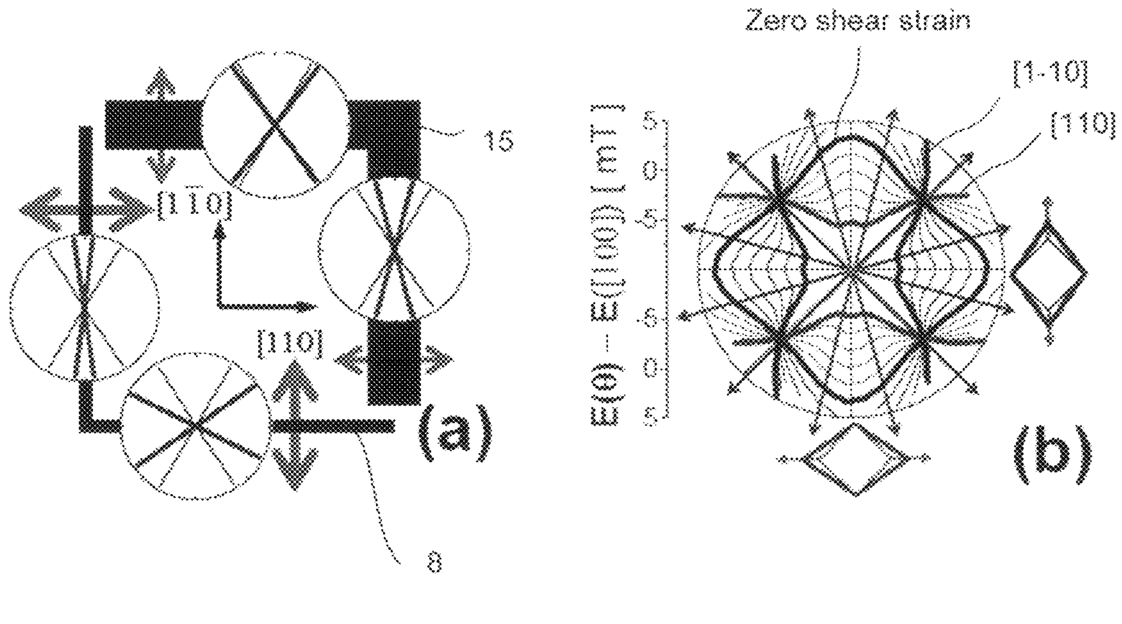
FIG. 6*a* illustrates easy axis orientations for [110] and [1$\bar{1}$0]orientated arms of a device similar to that shown in FIG. 2*a* and also for the device shown in FIG. 2*a;*
FIG. 6*b* shows plots of theoretical magnetocrystalline energy values as a function of in-plane magnetisation angle at different strains and along different directions.

FIG. 6*a* illustrates easy-axes orientations in the [1$\bar{1}$0]- and [110]-bars of the other 'L'-shaped device 15 and the L'-shaped device 8. Arrows 16 indicate the direction and strength of the patterning induced lattice relaxation.

In FIG. 6*b*, calculated magnetocrystalline energies are plotted as a function of the in-plane magnetization angle for f=0.3 and $e_{xy}$ ranging from zero (no in-plane lattice relaxation) to typical values expected for the [1$\bar{1}$0]-bar ($e_{xy}$>0) and for the [110]-bar ($e_{xy}$<0). In particular, energies are plotted for as a function of the in-plane magnetization angle for zero shear strain (black line), for $e_{xy}$=0.004, . . . , 0.02% corresponding to lattice extension along [110] axis and for $e_{xy}$=−0.004, . . . , −0.02% corresponding to lattice extension along [1$\bar{1}$0] axis. The magnetic easy axes are ar at $e_{xy}$=0, 0.02% and −0.02%. Lattice deformations breaking the [1$\bar{1}$0]-[110] symmetry of the microscopic magnetocrystalline energy profile are illustrated by the diamond-like unit cells extended along [110] axis for the [110]-bar (bottom diamond) and along the [110] axis for the [110]-bar (right diamond).

Consistent with the experiment, the minima at [100] and [010] for $e_{xy}$=0 move towards the [1$\bar{1}$0] direction for lattice expansion along [110] direction ($e_{xy}$>0) and towards the [110] direction for lattice expansion along [1$\bar{1}$0] direction (e<0). The asymmetry between experimental easy-axes rotations in the two bars is due to the [110] uniaxial component already present in bulk material whose microscopic origin is not known, but can be modelled by an intrinsic (not induced by micro-patterning) strain bulk $e_{xy}^{bulk}$~+0.01%.

The devices just described use the mutual strain relaxation induced by micro-patterning of stripes from GaMnAs with in-plane magnetic anisotropy grown under compressive strain. On the other hand, wires which are patterned from tensile strained GaMnAs with perpendicular magnetic anisotropy relax by reducing their lattice constant. In this case, micro-patterning weakens the perpendicular magnetic anisotropy compared to the tensile strained GaMnAs bulk layer.

Ferromagnetic metals also exhibit a sensitive dependence of the magnetocrystalline anisotropy on local strain. Any distortion of the equilibrium lattice changes the local anisotropy. In ultrathin films, strain is induced by the growth on a surface. Therefore, similar to GaMnAs, ultrathin layers of cobalt (Co), or iron (Fe) epitaxially grown on a GaAs [001] substrate exhibit both cubic magnetic anisotropy of the bulk, as well as a uniaxial contribution stemming from the interface.

Magnetic Anisotropy Due to Charge Carrier Density Variations

Figure 7:
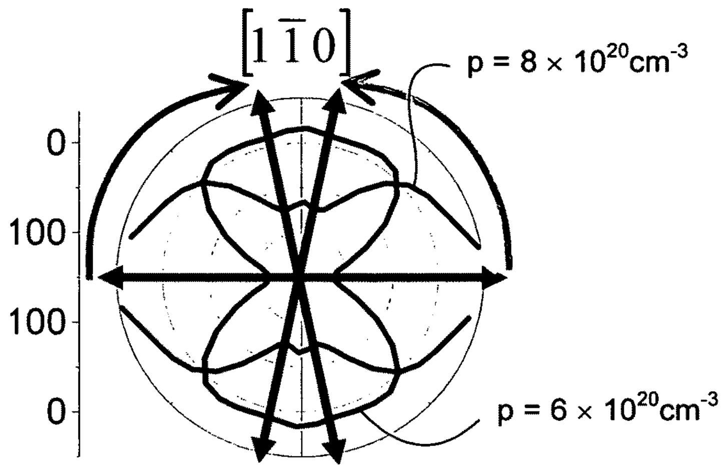
FIG. 7 illustrates a magnetocrystalline energy profile of $Ga_{0.96}Mn_{0.04}As$ grown on [001]-orientated GaAs under compressive strain for two different carrier concentrations.

FIG. 7 shows magnetocrystalline energy profile of transverse strained $Ga_{0.96}Mn_{0.04}As$ grown on GaAs [001] under compressive strain of $e_0$=−0.2% with lattice deformation (expansion) along [1$\bar{1}$0] of $e_{xy}$=−0.02% for a first carrier density, p, of =$8\times10^{20}$ $cm^{-3}$ and a second carrier density, p, of $6\times10^{20}$ $cm^{-3}$. First and second arrows 17, 18 indicate orientation of the easy axis for the first and second carrier densities respectively.

As shown in FIG. 7, changes in carrier density can yield variation of the magnetic anisotropy in strained GaMnAs. Although changing the carrier-density in a highly doped (~$10^{20}$-$10^{21}$ $cm^{-3}$) bulk semiconductor may be difficult to achieve due to a short screening length, significant carrier density variations may be realized in sufficiently (electrically) isolated nanostructures.

Theoretical calculations similar to those presented in FIG. 6*b* above indicate a sensitive dependence of the magnetic anisotropy on the carrier density. As shown, FIG. 7, a reduction of ~25% in carrier concentration changes the easy axes by about 90° from ~[1$\bar{1}$0] to [110]crystallographic orientation.

Further embodiments of the invention will now be described which realize electric field induced variations of the magnetic anisotropy. These include changing the charge carrier density in a strained ferromagnetic semiconductor, shifting the centre of maximal carrier concentration in an inhomogenously strained ferromagnetic semiconductor system, and changing strain in a ferromagnetic layer by attaching a piezoelectric layer to the ferromagnetic layer or by exploiting piezoelectric properties of the ferromagnetic material itself, as is possible in, for example, GaMnAs (which has piezoelectric properties similar to conventionally doped GaAs).

Further Magnetoresistance Devices

Further embodiments of magnetoresistance devices in accordance with the present invention will now be described.

Firstly, magnetoresistance devices will be described in which application of an electric field pulse causes a change in charge carrier density in a ferromagnetic region which in turn causes a change in magnetic anisotropy which causes the magnetisation to begin precession.

Figure 8:
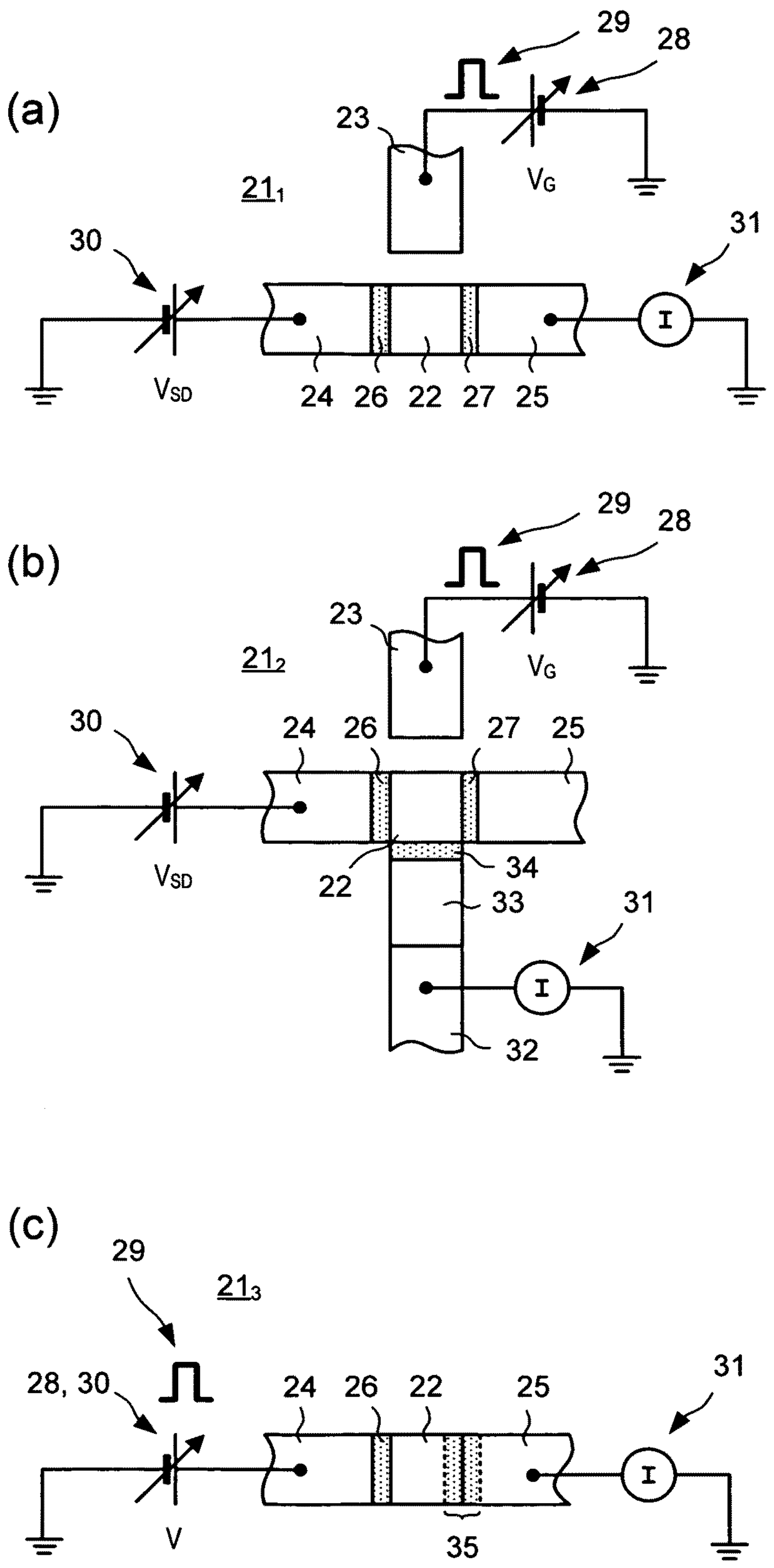
FIGS. 8*a*, 8*b* and 8*c* is a schematic view of first, second and third devices in which orientation of magnetic anisotropy in a ferromagnetic element can be varied in accordance with the present invention.

Referring to FIGS. 8*a* and 8*b*, first and second magnetoresistive devices $\mathbf{21}_1$, $\mathbf{21}_2$ are shown. The second devices $\mathbf{21}_2$ are variants of the first device $\mathbf{21}_1$.

Each device $\mathbf{21}_1$, $\mathbf{21}_2$ includes a ferromagnetic region 22 (herein also referred to as a ferromagnetic "island") which is under strain. In these examples, the ferromagnetic region 22 comprises a ferromagnetic semiconductor, such as (Ga,Mn) As. However, a different ferromagnetic semiconductor may be used.

The orientation of magnetisation of the ferromagnetic region 22 can be changed or helped to change by applying a short electric field pulse using a gate 23 capacitively coupled to the ferromagnetic region 22. Applying the electric field pulse causes a change in charge carrier density in the ferromagnetic region 22 which in turn causes a change in magnetic anisotropy which causes the magnetisation to begin precession. The ferromagnetic region 22 may be sufficiently small that it exhibits charging effects at a given operating temperature, such as at 4.2° K. For example, the ferromagnetic region 22 may have dimensions (layer thickness and lateral diameter) of the order of 1 or 10 nm. However, the ferromagnetic region 22 may be larger, for example having dimensions of the order of 100 nm, 1 μm or higher.

The ferromagnetic island 22 is disposed between first and second leads 24, 25, and is weakly coupled to the leads 24, 25 by respective tunnel barriers 26, 27. In some embodiments, there may be more than one island of ferromagnetic material, for example arranged in chain.

Reorientation of magnetisation is triggered using a pulse generator 28 which applies a voltage pulse 29 to the gate 23.

Direction of orientation can be measured in different ways.

For example, in the first device $\mathbf{21}_1$, orientation of magnetisation can be determined by measuring tunnelling anisotropic magnetoresistance (TAMR) using voltage source 30 and current detector 31. If the first and/or second lead 24, 25 is ferromagnetic, then the orientation of magnetisation can be determined by measuring tunnelling magnetoresistance (TMR) using voltage source 30 and current detector 31. In either case, the measurement involves applying a voltage so as to drive a current and measuring current.

In the second device $\mathbf{21}_2$, orientation of magnetisation can be determined using by measuring TMR using the voltage source 30 and the current detector 31. However, the bias is applied across and current is measured between the first lead 24 and a third lead 32 which is connected to a pinned ferromagnetic region 33 which is separated from the ferromagnetic island 22 by a tunnel barrier 34. It will be appreciated that a different measurement configuration can be used.

Figure 9:
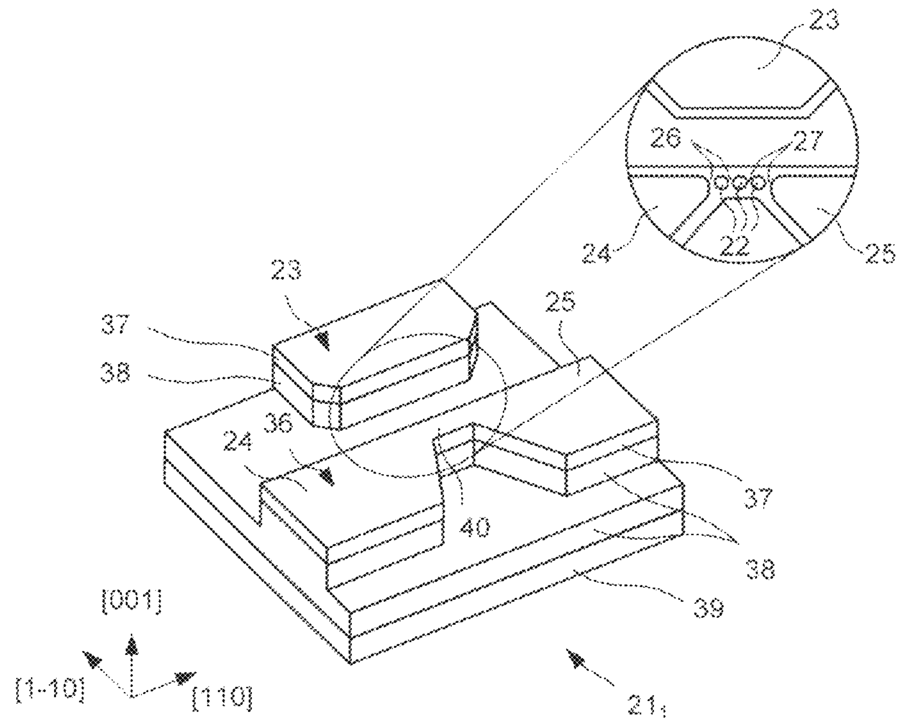
FIG. 9 is a perspective view of the first device shown in FIG. 8*a;*

Referring to FIG. 9, the first device $\mathbf{21}_1$ is shown in more detail.

The first device $\mathbf{21}_1$ has an elongate conductive channel 36 with the gate 23 arranged to the side of the channel 36, i.e. in a side gate configuration. The channel 36 and side gate 23 are formed in a patterned layer 37 of (Ga,Mn)As by trench-isolation. A layer 38 of AlAs electrically isolates the channel 36 and the side gate 23 from a GaAs substrate 39. The channel 36 includes a constriction 40 disposed between wider portions which provide the leads 24, 25 to the constriction 40.

The (Ga,Mn)As layer 37 comprises 2% Mn, i.e. $Ga_{0.98}Mn_{0.02}As$, and has a thickness of 5 nm, although the effective thickness may be about 3 nm due to surface oxidation. The constriction 40 is 30 nm wide and 30 nm long. The channel 36 is 2 μm wide. The channel 36 and the gate 23 are separated by about 30 nm.

In the region of the constriction 40, potential fluctuations arising from disorder create at least one conductive island 22 and at least a pair of tunnel barriers 26, 27 which weakly couple the island 22 to leads 24, 25 and/or adjacent islands 22.

Figure 10:
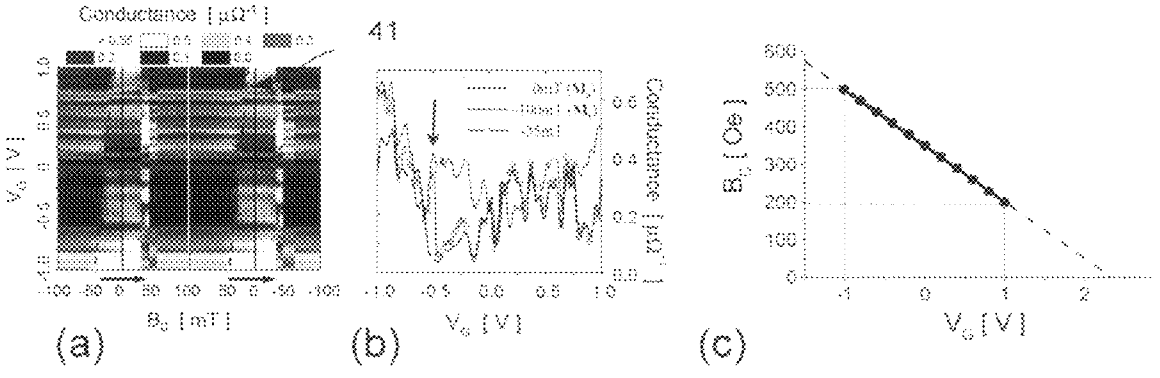
FIG. 10*a* is a plot of channel conductance against gate voltage and in-plane, parallel-to-current magnetic field for the device shown in FIG. 10*a;*
FIG. 10*b* shows Coulomb blockade oscillations for the device shown in FIG. 9.
FIG. 10*c* shows a plot of critical reorientation magnetic field against gate voltage for the device shown in FIG. 9.

Referring to FIGS. 10*a* to 10*c*, characteristics of the first device 22, will be described.

FIG. 10*a* is a greyscale plot of channel conductance against gate voltage and in-plane parallel-to-current magnetic field. A dashed line 41 highlights critical reorientation field, $B_C$, which depends on gate bias. The critical reorientation field, $B_C$, decreases from about 40 mT at $V_G$=−1V to less than 20 mT at $V_G$=+1V.

Assuming a disk-shaped island 22, an effective disk diameter of about 10 nm can be estimated using the experimentally-found value of charging energy. Thus, about 40 Manganese acceptors are present on the island 22. About sixteen Coulomb oscillations are observed if $V_G$ is varied from −1V to +1V corresponding to a reduction of about 40% in carrier density. The critical reorientation field, $B_C$ drops down from about 50 mT at $V_G$=−1V to less than 20 mT at $V_G$=+1V.

FIG. 10*b* is plot of Coulomb blockade oscillations at $B_0$=0, where the island 22 remains at a magnetization $M_0$, and at $B_0$=−100 mT, where the island 22 remains at saturation magnetization $M_1$ over the gate voltage range between $V_G$=−1 and 1V. Conductance measurements at an intermediate field $B_0$=−35 mT show a transition from $M_0$ to $M_1$ at a critical gate voltage of about −0.5V.

FIG. 10*c* is a plot illustrating the dependence of critical reorientation field, $B_c$, against gate bias, $V_G$, between $V_G$=−1V and $V_G$=+1V. This indicates that a gate voltage pulse of amplitude $V_G \geq 2.5$V can trigger magnetic switching at $B_0$=0. It will be appreciated that, if different device structure and/or materials a used, then a similar plot can obtained and used to find the bias required to trigger magnetic switching.

Figure 11:
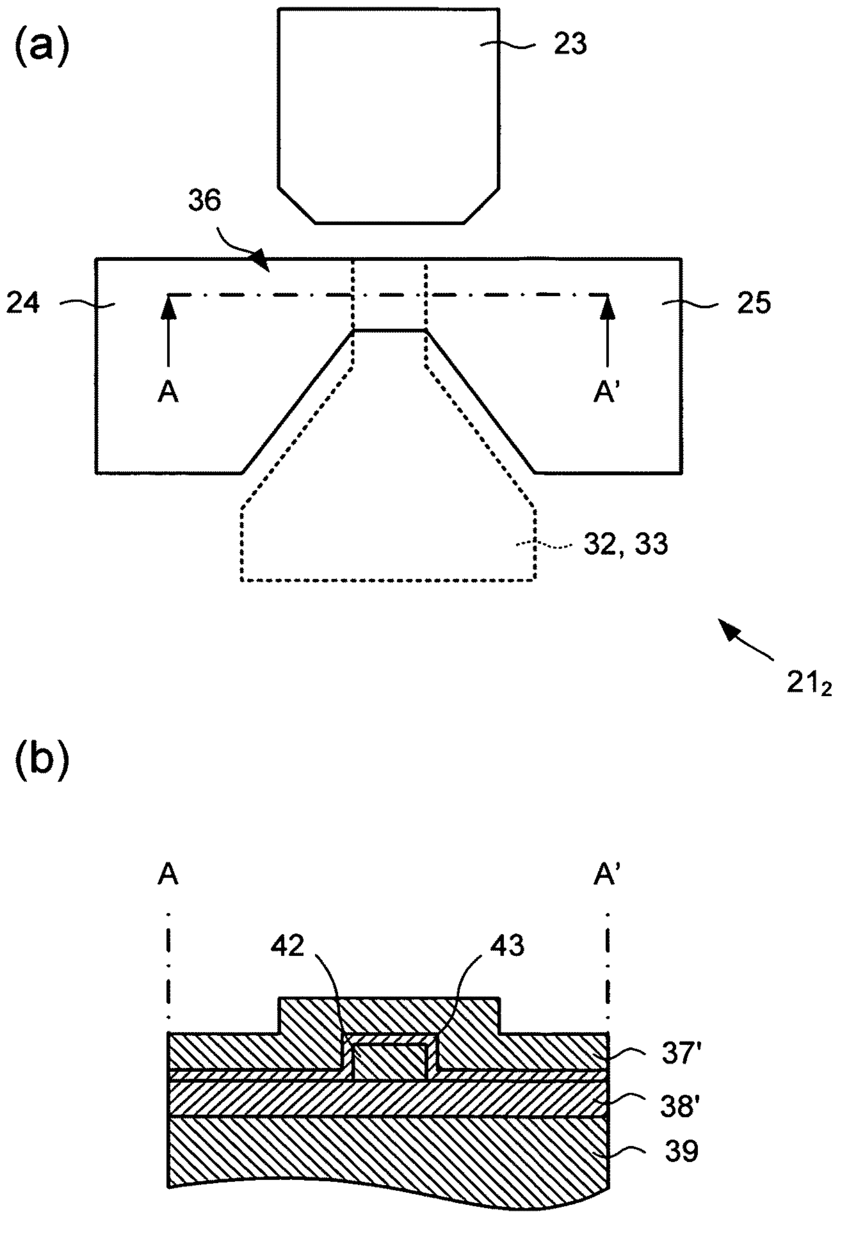
FIG. 11*a* is a plan view of the second device shown in FIG. 8*b;*
FIG. 11*b* is a cross-sectional view of the second device shown in FIG. 8*b* taken along the line A-A'.

As shown in FIGS. 11*a* and 11*b*, the second device $\mathbf{21}_2$ is a variant of the first device $\mathbf{21}_1$.

The devices $\mathbf{21}_2$ may be formed growing a layer of AlAs 38' on a GaAs substrate 39 followed by a layer of (Ga,Mn)As (not shown), patterning the (Ga,Mn)As to form a underlying electrode structure 42 comprising the pinned layer 32 and the third electrode 33 as a single piece, then growing a further layer of AlAs 43 and a further layer of (Ga,Mn)As over the patterned substrate and patterning the further layer of (Ga,Mn)As to form the channel 37' and gate 23.

An overlying electrode structure can be used instead of an underlying electrode structure. For example, the AlAs layer and (Ga,Mn)As layer forming the electrode may be grown after the channel and gate has been formed and patterned to form the electrode structure comprising the pinned layer and the third electrode. Alternatively, a thin gate dielectric, such as $Si_xN_y$, and a ferromagnetic material, such as Co may be deposited and patterned using lift-off or dry etching.

Figure 12:
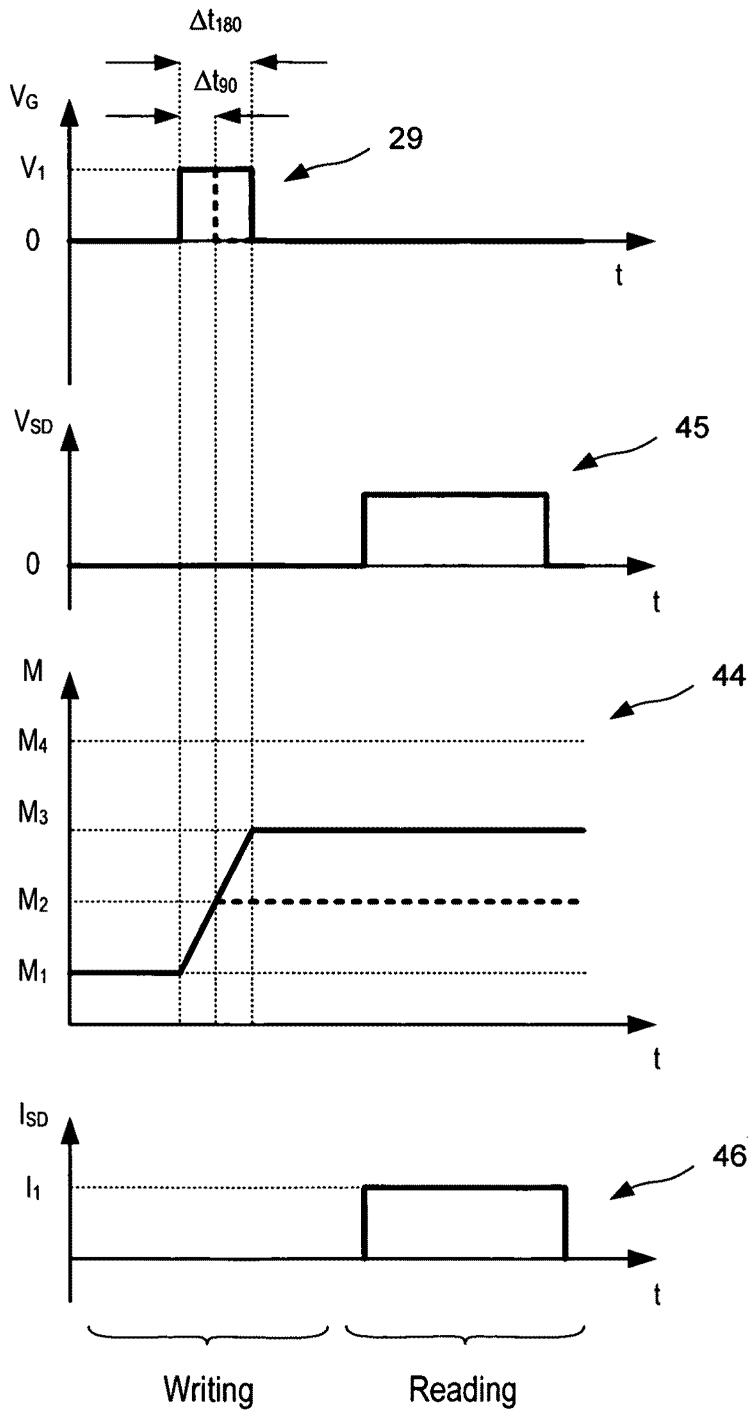
FIG. 12 illustrates writing and read cycles for the devices shown in FIGS. 8*a* and 8*b;*

Referring to FIG. 12, writing and reading cycles for the first and second devices $\mathbf{21}_1$, $\mathbf{21}_2$ are shown.

As will be explained in more detail later, the devices $\mathbf{21}_1$, $\mathbf{21}_2$ can exhibit four states $M_1$, $M_2$, $M_3$, $M_4$. However, the devices $\mathbf{21}_1$, $\mathbf{21}_2$ can exhibit fewer states, for example just two states which may be anti-parallel, or more states, for example six states by taking advantage of in-plane bi-axial anisotropy and perpendicular uni-axial anisotropy. Moreover, even if the devices $\mathbf{21}_1$, $\mathbf{21}_2$ can exhibit, for example, four states $M_1$, $M_2$, $M_3$, $M_4$, depending on whether, for example, the source and/or drain region is ferromagnetic, all states may be distinguishable or, alternatively, some states may be indistinguishable.

In the following, two types of write pulses will be described which causes magnetisation 44 of the ferromagnetic island 22, for one type of pulse (so-called "$t_{180}$" pulse), to switch between two states and, for another type of pulse (so-called "$t_{90}$" pulse), to switch between two "adjacent" states within four states.

It is noted that the plot of magnetisation 44 shown in FIG. 12 does not represent energy of magnetisation, but merely represents different states. In some embodiments, they may represent angle dependencies 0°, 90°, 180°, 270°.

In the following, so-called "toggle" switching is described, whereby applying a "$t_{180}$" pulse 29 repeatedly causes magnetisation 44 to "toggle" between two states, e.g. $M_1$ and $M_3$ representing '0' and '1'. However, a "$t_{90}$" pulse 29 repeatedly causes magnetisation 45 to "rotate" progressively from one state to a neighbouring state.

To write data to the device $\mathbf{21}_1$, $\mathbf{21}_2$, e.g. by switching between '0' and '1' states and vice versa, a voltage pulse 29 is applied to the gate 23.

The pulse 29 has duration, $t_{180}$, which is half the period of precession, $t_{precess}$. The precession period, $t_{precess}$, is given by:

$$t_{precess} = 1/f_{precess} = \frac{1}{\frac{\gamma}{2\pi}B_A} \tag{6}$$

where γ is the gyromagnetic constant $\gamma = g\mu_B/\hbar$ ($2.2\times10^{15}$ $mA^{-1}s^{-1}$), $B_A$ is the magnetic anisotropy field and may include a demagnetising field, created by divergence in the magnetisation, e.g. at sample, grain, domain wall or other types of boundaries, and causes shape anisotropy. In this example, $t_{precess}$ is about 1 ns. The value of $t_{precess}$ may lie typically in the range of 100 ps to 10 ns (for $B_a$ 100 mT to 1 mT).

The magnitude of the voltage pulse, $|V_G|$, is of the order of 1 or 10 V.

As explained earlier, an external magnetic field may be applied to help stabilise magnetisation or to facilitate precession. The external magnetic field may be provided by a permanent magnet (not shown) or by a conductive track (not shown) and preferably has a magnitude which is about the same order but smaller than the anisotropy field, for example of the order of 1 to 100 mT.

In some embodiments, an external magnetic field and/or spin transfer torque current may be used to write a particular state (as opposed to toggle between states) by orientating the magnetisation 44 in a particular direction. Herein, this is referred to as "direct writing".

In embodiments in which a magnetoresistance device has pinned and free ferromagnetic layers separated by an insulating layer, re-orientation of the magnetisation may achieved by applying the electric field pulse and simultaneously or shortly afterwards applying a spin transfer torque (STT) current pulse. By "shortly afterwards", we mean within a period of time that magnetisation is still undergoing precession following application of the electric field pulse and has not been damped. Typically, the period of time is between 0 and 5 ns.

To read data from the device $21_1$, $21_2$, a bias pulse 45 is applied between the source 24 and drain 25 of the device $21_1$, $21_2$ and the current 31, i, is measured. The magnitude of the current depends on the tunnelling anisotropic magnetoresistance (TAMR) and/or the tunnelling magnetoresistance (TMR) of the device which in turn depends on the orientation of magnetisation 44 of the ferromagnetic region 22 which represents '0' and '1' states.

As explained earlier, orientation of more than two states can be determined by measuring anisotropic magnetoresistance effects such as AMR, TAMR and CBAMR or by measuring a transverse Hall voltage between lead 32 and a reference (e.g. ground) arising from the anomalous Hall effect for states along a perpendicular-to plane magnetic easy axis.

Figure 13A:
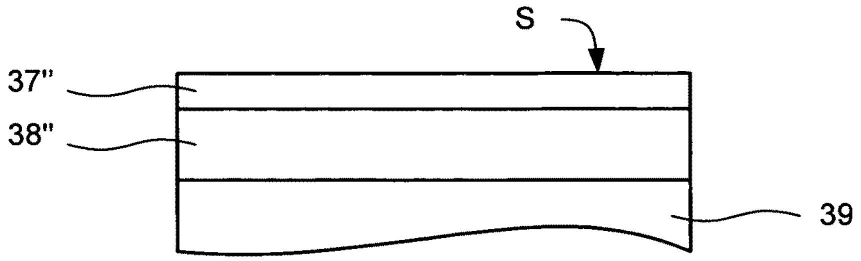
FIGS. 13*a*, 13*b* and 13*c* illustrate fabrication of the first device shown in FIG. 8*a* at different stages.
Figure 13B:
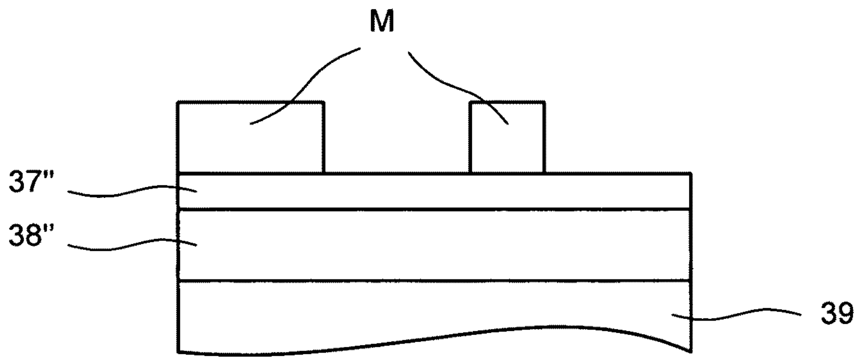
Figure 13C:
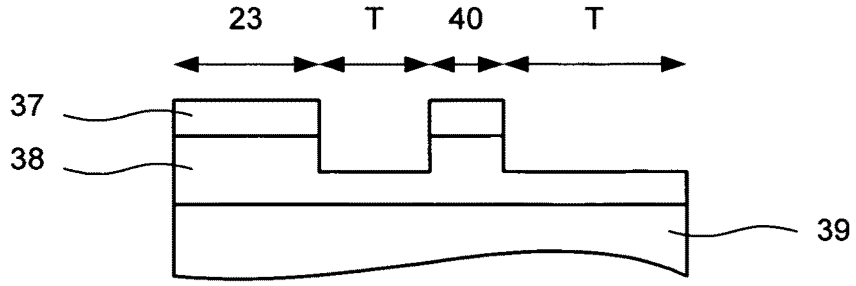

Referring to FIGS. 13*a*, 13*b* and 13*c*, fabrication of the first device $21_1$ will now be described.

Referring to FIG. 13*a*, the device $21_1$ is fabricated from an ultra-thin (5 nm) $Ga_{0.98}Mn_{0.02}As$ epilayer 37" grown along the [001] crystal axis on a AlAs 38" buffer layer on a GaAs substrate 39 by low-temperature molecular beam epitaxy (LT-MBE) and reference is made to "High-quality GaMnAs films grown with arsenic dimers" by R. P. Campion, K. W. Edmonds, L. X. Zhao, K. Y. Wang, C. T. Foxon, B. L. Gallagher and C. R. Staddon, Journal of Crystal Growth, volume 247, p 42 (2003).

Due to the high reactivity of the GaMnAs layer to alkaline developers used in optical lithography, Hall bar 14 is defined using electron-beam lithography using a poly-methyl-methacrylate (PMMA) resist developed using ultrasound in a methyl isobutyl ketone/isopropanol 1:3 mixture at 25° C.

Thermally-evaporated, high-electron-contrast Cr/Au registration marks (not shown) having thicknesses of 20 nm and 60 nm respectively are patterned by lift-off using 1 μm-thick resist (not shown) and ~250 nm electron-beam diameter. A 30 s dip in 10% HCl solution is used prior to evaporation to assist adhesion of metal without unduly damaging the GaMnAs.

A ~200 nm-thick layer of resist (not shown) is applied to the surface S of the $Ga_{0.98}Mn_{0.02}As$ epilayer 37. The finest features are defined using an electron-beam (not shown) having a ~15 nm beam diameter and ~5 pA current, with on-chip focusing at adjacent registration marks. Less-critical areas (not shown) are defined in the same resist by a ~250 nm beam at ~1 nA. The high-resolution regions are arranged to be as small as possible to minimise write time and pattern drift.

Referring to FIG. 13*b*, the resist is developed to leave a patterned resist layer M as an etch mask.

Referring to FIG. 13*c*, reactive-ion etching (RIE) is used for trench isolation. Any RIE-related conductivity impairment is expected to be minimal compared with the high conductivity of the GaMnAs. The pressure in the RIE chamber (not shown) is 20 mTorr, with 20 sccm flow of both $SiCl_4$ and Ar to provide the required mix of physical and chemical etch action suitable for removing both GaAs and manganese. A typical etch of 10-15 s at 100 W yielded a trench T having a depth of 20-30 nm, safely through the GaMnAs layer.

Cr/Au (20 nm/300 nm) bond pads are thermally evaporated, again preceded by an adhesion dip in HCl solution. The bond pads form a low-resistance electrical contact to the GaMnAs layer and no separate ohmic metallisation is required.

In this example, devices are arranged in a Hall-bar layout aligned along [110] direction, with a 2 μm-wide channel and three pairs of Hall sensor terminals of 500 nm width at 10 μm intervals either side of the constriction. However, other arrangements can be used.

The fabrication process hereinbefore described is modified to fabricate the second devices $21_2$.

A different initial layer structure is used having a thicker GaMnAs layer, e.g. 25 nm thick. The layer structure is patterned using electron beam lithography and RIE to form an underlying electrode structure 44 (FIG. 11*a*). Then, another AlAs layer (having a thickness of 3 nm) and a layer of GaMnAs are grown by LT-MBE as described above. The structure is patterned to define the channel in a similar way to the first device $21_1$.

Techniques may be used to minimise contamination between patterning the underlying electrode structure 44 (FIG. 11*a*) and growing the AlAs and GaMnAs layers. For example, the underlying electrode structure 44 (FIG. 11*a*) may be patterned using ion-beam milling immediately after growth of the initial layer structure, then the additional layers grown without breaking vacuum.

Referring to FIG. 8*c*, a third magnetoresistive device $21_3$ is shown.

The third device $21_3$ is a two-terminal device having a ferromagnetic region 22 disposed between first and second leads 24, 25 and is weakly coupled to one of the leads 24 by a tunnel barrier 26 and to the other lead 25 by a tunable barrier 35 provided by a region of depletion formed by the semiconducting ferromagnetic region 22 and the lead 25.

In this example, the ferromagnetic region 22 comprises a p-type semiconductor, e.g. Ga(Mn,As) and the lead 25 comprises an n-type semiconductor, e.g. Si doped GaAs, and so the tunable barrier 35 is a reversed-biases p-n junction. However, the lead may be metallic and so the tunable barrier 35 may be a Schottky barrier.

Figure 14:
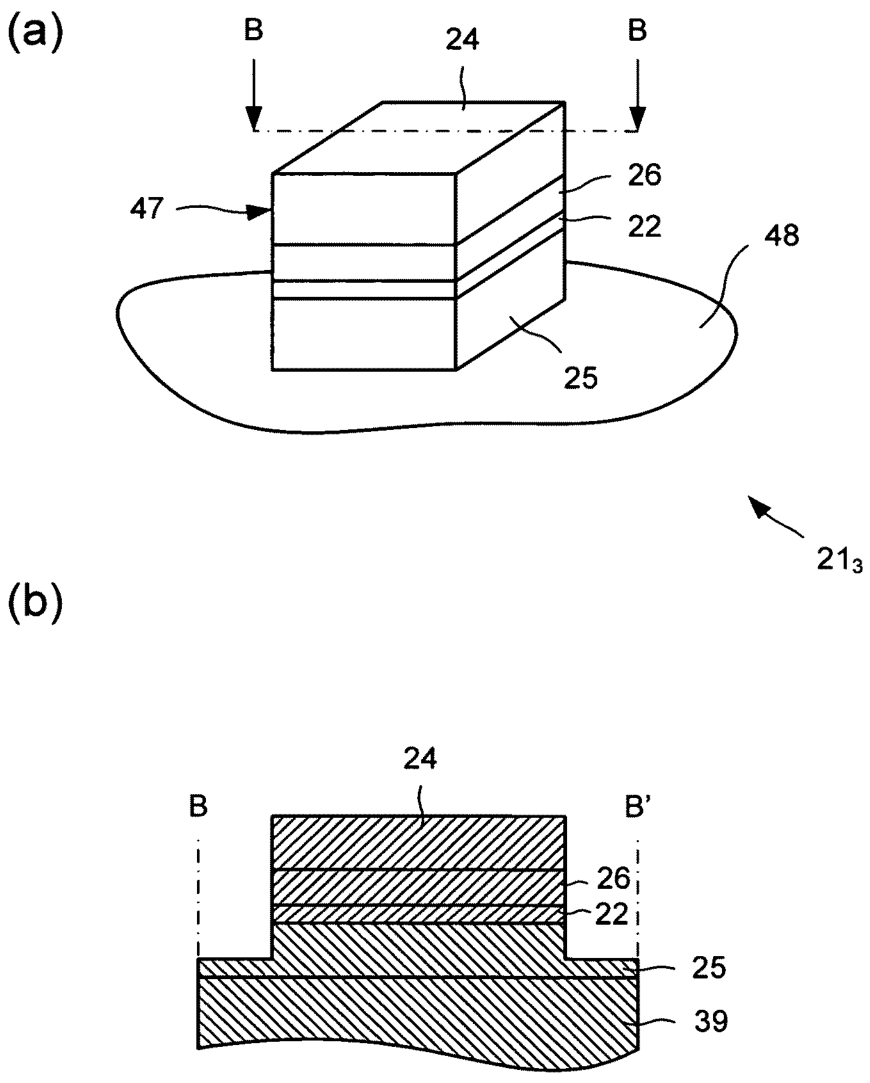
FIG. 14*a* is a perspective view of the third device shown in FIG. 8*c;*
FIG. 14*b* is a cross-sectional view of the third device taken along the line B-B'.

Referring in particular to FIGS. 14*a* and 14*b*, the third device $21_3$ is shown in more detail.

The device $21_3$ comprises a pillar 47 upstanding from a substrate 48. The pillar 47 includes a layer 25 of GaAs doped to a concentration of the order of $1-10\times10^{18}$ $cm^{-3}$ and having an (unetched) thickness of 200 nm, a layer 22 of p-type $Ga_{0.98}Mn_{0.02}As$ having a thickness of about 5 nm, a layer 26 of AlAs having a thickness of 25 nm and a layer of Au having a thickness of about 10 nm.

The device is fabricated from a layer structure (not shown) grown on an GaAs substrate (not shown) comprising, in order a 200 nm thick layer of n-type GaAs (not shown), a 5 nm thick layer of $Ga_{0.98}Mn_{0.02}As$ and a 25 nm thick layer of AlAs. The $Ga_{0.98}Mn_{0.02}As$ is grown by low-temperature molecular beam epitaxy (LT-MBE).

Electron beam lithography and thermal evaporation are used to define a pad of gold (Au) having a thickness of the order of 10 nm on the surface of the layer structure (not shown) and $SiCl_4$/Ar RIE is used to define the pillar 47.

To contact the top of the pillar 47, the pillar may be planarised using, for example polyimide, and depositing a gold contact pad.

A non-magnetic ohmic contact is used to contact the substrate.

Figure 15:
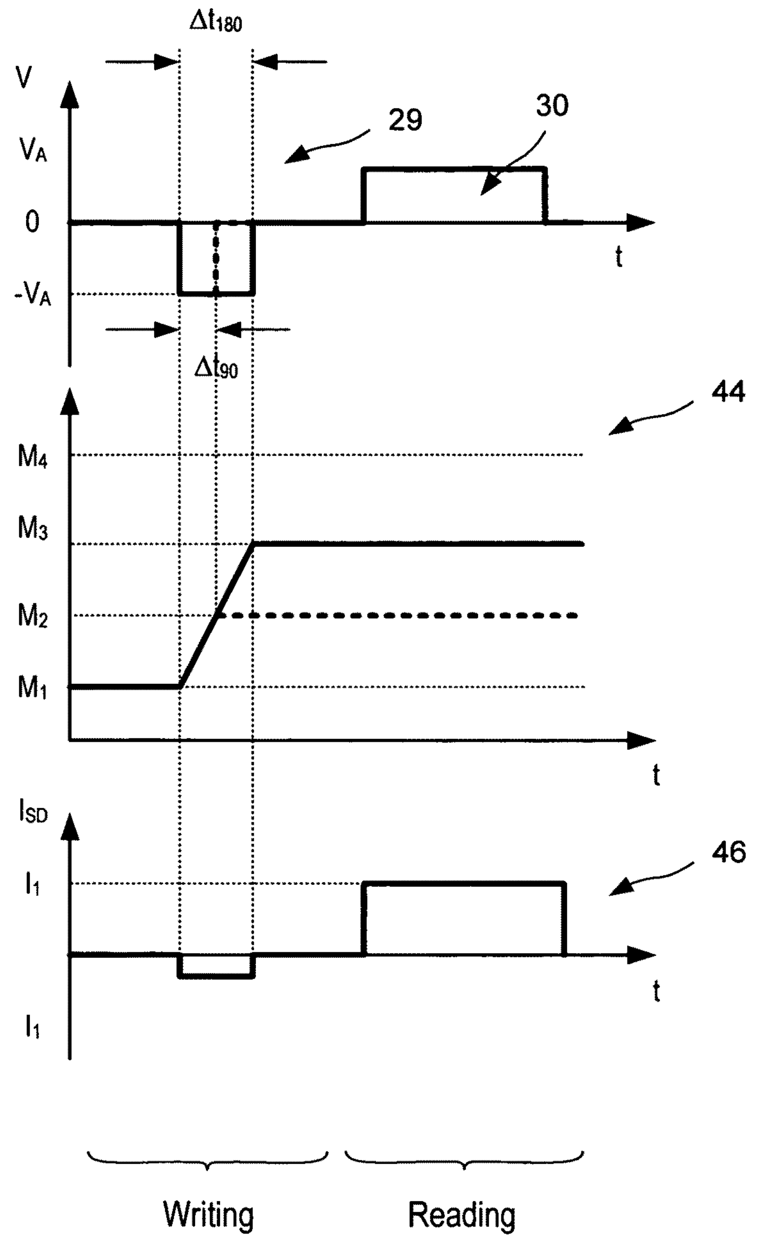
FIG. 15 illustrates writing and read cycles for the device shown in FIG. 8*c;*

Referring to FIG. 15, writing and reading cycles for the third devices $21_3$ are shown.

Similar to the first and second devices 21$_1$, 21$_2$ described earlier, the third device 21$_3$ can exhibit can exhibit four states $M_1$, $M_2$, $M_3$, $M_4$.

The third device 21$_3$ differs in that the polarity of a voltage pulse 29 determines whether it is a write or read pulse.

To write data to the device 21$_3$, a negative voltage pulse 29 is applied to the lead 24 adjacent to the fixed tunnel barrier relative to the other lead 25 so as to reverse bias the p-n junction 35 and increase the width of the depletion region to increase depletion and vary the carrier density or carrier density distribution in the ferromagnetic region 22 and, thus, induce precession. As explained earlier, the duration of the pulse can be use to switch between two states or between more than two states, in other words using $t_{90}$ and $t_{180}$ pulses.

To read data, a positive bias pulse 30 is applied to the lead 24 adjacent to the fixed tunnel barrier relative to the other lead 25 and the magnetization orientation depending current 46, i, is measured.

Figure 16:
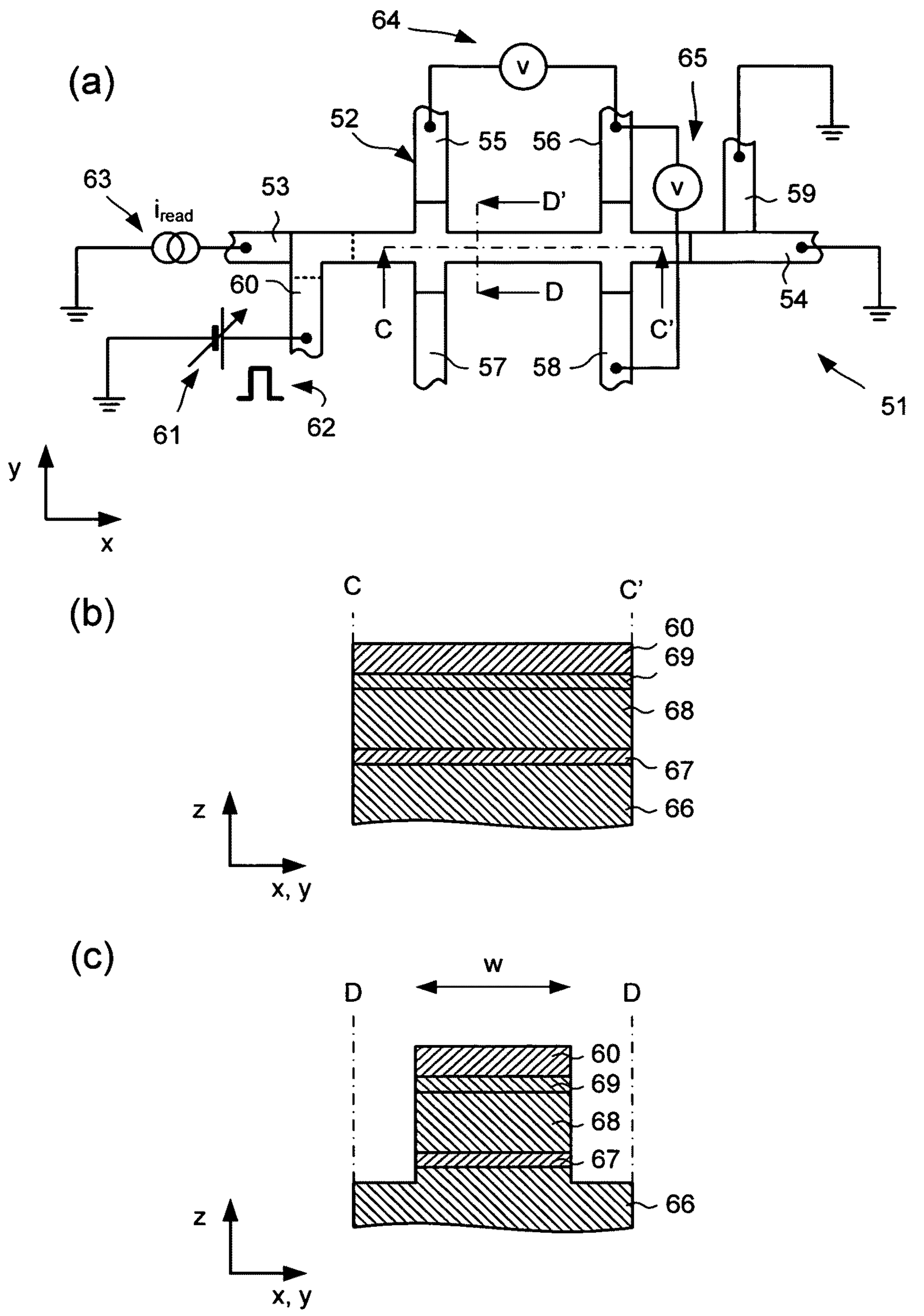
FIG. 16*a* is a plan view of another device in which orientation of magnetic anisotropy in a ferromagnetic element can be varied in accordance with the present invention.
FIG. 16*b* is a longitudinal cross-sectional view of the device shown in FIG. 16*a* taken along the line C-C'.
FIG. 16*c* is a transverse cross-sectional view of the device shown in FIG. 16*a* taken along the line D-D'.

Referring to FIGS. 16*a*, 16*b* and 16*c*, a magnetoresistive device 51 will now be described in which application of an electric field pulse causes a shift in maximal carrier concentration in an inhomogeneously strained ferromagnetic semiconductor which in turn causes a change in magnetic anisotropy and so initiates precession of magnetisation.

The device 51 comprises a Hall bar 52 which is generally elongate having width, w, of about 1 μm and a length, 1, of about 20 μm. The Hall bar 52 has first and second end leads 53, 54 and first, second, third and fourth side leads 55, 56, 57, 58 arranged in pairs on opposite sides of the bar 52. The Hall bar 52 is sandwiched between underlying and overlying electrodes 59, 60, hereinafter referred to as "bottom" and "top" electrodes respectively.

As shown, a pulse generator 61 is used to apply a voltage pulse 62 between the top and bottom electrodes 59, 60. A current source 63 is used to apply a read current, $i_{read}$, through the Hall bar 52 between the first and second end leads 53, 54. First and second voltage meters 64, 65 measure bias between the first and second leads 55, 56 and between the second and fourth side leads 56, 58 so as to determine longitudinal and transverse anisotropic magnetoresistance (AMR) respectively. The bias measured between the second and third side leads 56, 57 can also be used to measure the anomalous Hall effect (AHE) resistance.

An AMR measurement can be used to distinguish between two states where magnetization rotates by less than 180°, e.g. 90°, in a ferromagnetic layer exhibiting biaxial, in-plane anisotropy at $V_G=V_0$, for example $V_0=0$.

An AHE measurement can be used to distinguish between up and down states in a system with perpendicular anisotropy at $V_G=V_0$.

Referring in particular to FIGS. 16*b* and 16*c*, the Hall bar 52 is formed on an indium gallium arsenide ($In_{0.05}Ga_{0.95}As$) substrate 66 which serves as the bottom electrode 59. The Hall bar 52 includes a base barrier layer 67 formed of AlAs overlying the InGaAs substrate 66, an inhomogeneously-strained ferromagnetic layer 68 formed of graded InGaMnAs and a top barrier layer 69 formed of AlAs. The top gate electrode 60 is formed of Al.

The lattice constant within the ferromagnetic layer 68 is controllably varied so as to produce inhomogeneous strain within the layer 68. The lattice constant of $In_{0.03}Ga_{0.97}As$ is larger than the lattice constant for $Ga_{0.95}Mn_{0.05}As$ so that the subsequent $Ga_{0.95}Mn_{0.05}As$ grown on $In_{0.03}Ga_{0.97}As$ is tensile strained. Further on, Indium is introduced again to form InGaMnAs. The Indium concentration is increased until the lattice constant of InGaMnAs becomes larger than the lattice constant of the InGaAs substrate to achieve compressive strain.

The device 51 is fabricated from a wafer 70 comprising an indium gallium arsenide ($In_yGa_{1-y}As$) substrate 66' (y=5%), a layer of aluminium arsenide (AlAs) 67' having a thickness of ~20 nm, a graded layer of indium gallium manganese arsenide ($In_zGa_{1-x-z}Mn_xAs$) 68', which includes a base layer of GaMnAs 68$_1$', and which has a thickness of ~10 nm.

Figure 17:
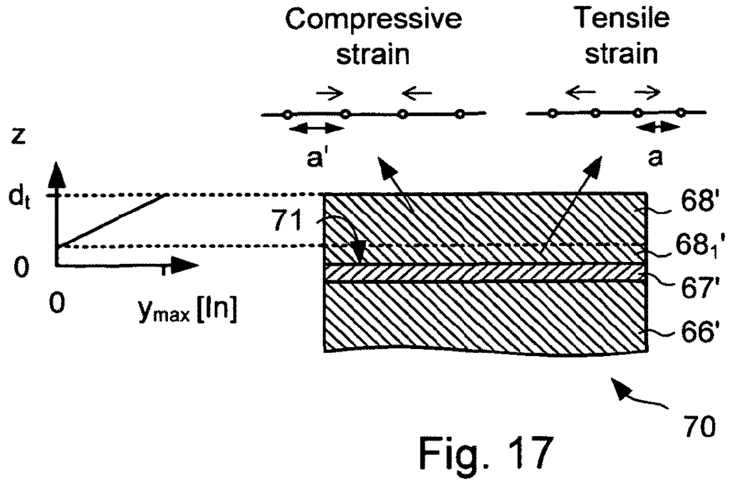
FIG. 17 illustrates a layer structure used to fabricate the device shown in FIG. 15.

Referring to FIG. 17, a layer 68$_1$' of $Ga_{1-x}Mn_xAs$ is epitaxially grown under tensile strain on top of the AlAs layer 67' which in turn is grown on the $In_yGa_{1-y}As$ substrate 66'. In this example, the concentration of manganese is 5%, i.e. x=0.05 and the concentration of indium increases from z=0 to 10%.

The wider lattice constant of the $In_yGa_{1-y}As$ substrate 66' is transmitted to the $Ga_{1-x}Mn_xAs$ layer 68$_1$' which introduces tensile strain. During further growth of the $In_zGa_{1-x-z}Mn_xAs$ 68', indium is introduced to increase further the lattice constant by thereby forming a quaternary alloy, InGaMnAs. The indium concentration [In] increases with increasing distance, d, from the base 71 of the layer 68$_1$.

Different strain profiles can be used. For example, instead of the strain within the ferromagnetic layer 68 varying from being tensile closer to the substrate to being compressive further away from the substrate, it may change from being compressive to tensile. This can be achieved by fabricating the device from a wafer having a gallium arsenide (GaAs) substrate instead of $In_yGa_{1-y}As$ substrate and introducing phosphorous (P) instead of indium (In) to form a graded layer of gallium manganese phosphide arsenide ($Ga_{1-x}Mn_xP_zAs_{1-z}$). The lattice constant is reduced as the phosphorous concentration is increased.

Figure 18:
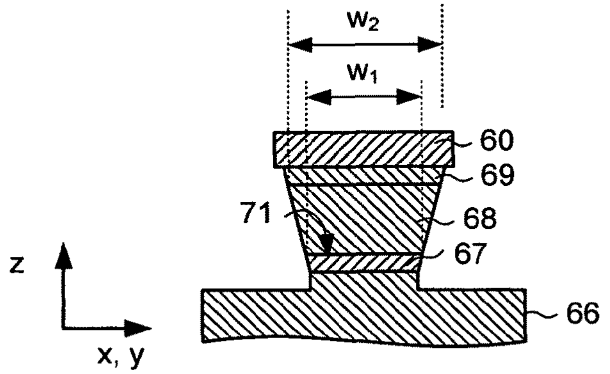
FIG. 18 is a transverse cross-sectional view of a modified version of the device shown in FIG. 16*a;*

Referring to FIG. 18, strain can also be varied by changing the shape of ferromagnetic layer 68. For example, the width of the ferromagnetic layer 68 may be made narrower at the base 71 of the layer 68 having a width $w_1$ and made wider further away from the base 71 having a width $w_2>w_1$. Thus, the lattice is more relaxed in the thinner, lower part of the layer 68 than in the thicker, upper part of the layer 68. The ferromagnetic layer 68 may be homogenously doped.

Figure 19:
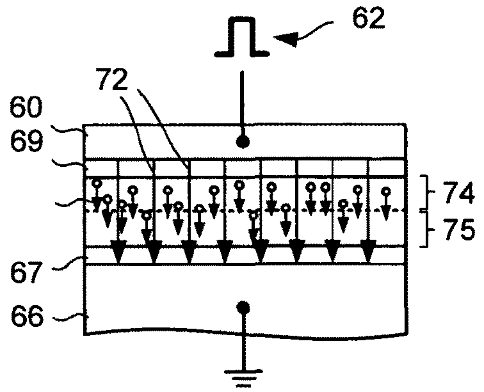
FIG. 19 schematically illustrates varying carrier distribution with a ferromagnetic semiconductor.
Figure 19A:
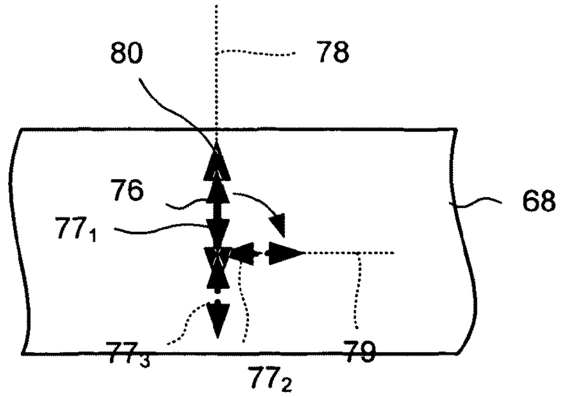
FIG. 19*a* illustrates re-orientation of magnetic anisotropy.

Referring to FIGS. 19 and 19*a*, by applying a gate pulse 62 between the two gates 59, 60, an electric field 72 is generated which shifts charge carriers 73 (here only holes, the majority carriers, are illustrated) and alters charge carrier concentration in a lower, tensile-strained region 74 and in an upper, compressively-strained region 75. In particular, the pulse draws carriers 73 from the lower, tensile-strained region 74 into the upper, compressively-strained region 75 so as to increase charge carrier density in the upper, compressively-strained region 75.

Table 2 below identifies orientation of magnetic anisotropy with strain and carrier concentration:

TABLE 2

| | Tensile Strain | Compressive strain |
|---|---|---|
| High carrier concentration | Out of plane | In plane |
| Low carrier concentration | In plane | Out of plane |

Magnetic anisotropy 76 of the magnetic layer 68 changes from being orientated in a first position 77$_1$ perpendicular to the plane of the layer 68 (i.e. along axis 78) to a second orientation 77$_2$ orientated along the plane of the layer 68 (e.g. along axis 79). Thus, the effective anisotropy field $B_A$ rotates by 90°. This causes the magnetisation 80 to begin precession and to be re-orientated by 90 degree for a π/2-pulse.

As will be explained in more detail later, application of another, identical pulse 62 causes the effective anisotropy field $B_A$ to rotate again by 90° so that the magnetization continues precession by another 90°. Thus, the effective anisotropy field $B_A$ becomes again orientated along the out-of-plane axis 77, but the magnetization goes in a third orientation $\mathbf{77}_3$ which is anti-parallel to the first orientation $\mathbf{77}_1$. Notwithstanding this, the magnetoresistance of the first and third states (i.e. when the magnetisation 80 is aligned in these first and third orientations $\mathbf{77}_1$, $\mathbf{77}_3$) is the same. This is because, as explained earlier, an AMR measurement can distinguish between initial and final magnetization states only if they are not co-linear. An AHE measurement can distinguish between the two opposite magnetization orientations perpendicular-to-plane. A TMR measurement can distinguish between parallel and antiparallel orientation with respect to a fixed reference layer.

Writing and reading cycles are similar to those shown in FIG. 12 described earlier. However, during a read cycle, instead of applying a source-drain bias and measuring current, a current is driven through the device and the potential difference developed between leads 55, 56, 57, 58 is measured.

The device 51 is fabricated using similar techniques to those described earlier to fabricate the first device $\mathbf{21}_1$. For example, a layer structure is grown in a similar way to that described earlier and is patterned using electron-beam lithography and RIE.

Figure 20:
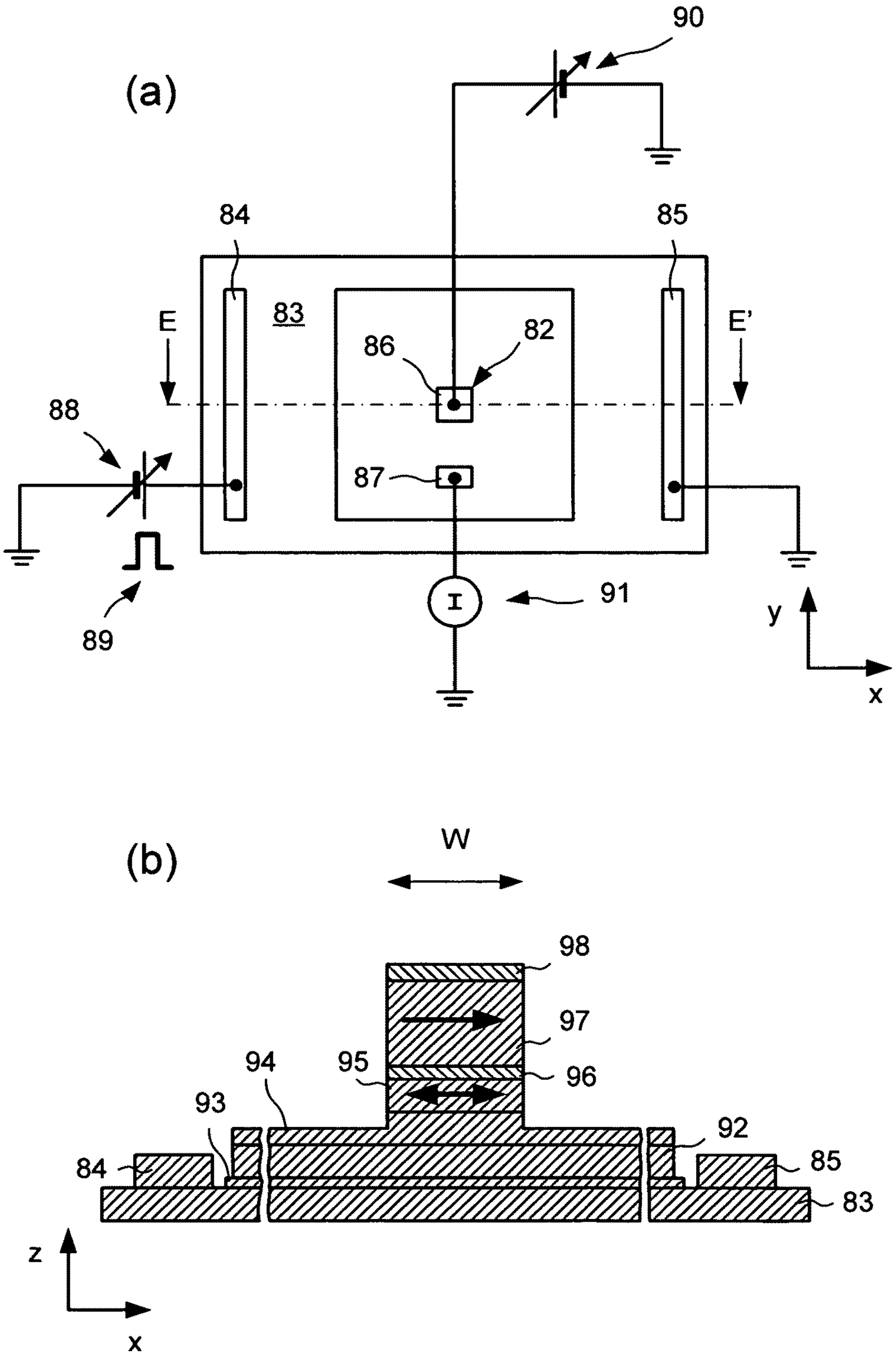
FIG. 20*a* is a plan view of a fourth device in which orientation of magnetic anisotropy in a ferromagnetic element can be varied in accordance with the present invention.
FIG. 20*b* is a cross-sectional view of a the device shown in FIG. 20*a* taken along the line E-E'.

Referring to FIGS. 20*a* and 20*b*, a fourth magnetoresistive device 81 will now be described in which application of a strain pulse causes a change in magnetic anisotropy and so starts precession of magnetisation.

The device 81 comprises a stacked layer structure 82 mounted on a piezoelectric layer 83 having first and second contact leads 84, 85. First and second contacts 86, 87 are used to provide electrical contacts to the layer structure 82.

The stacked layer structure 82 has a width, W, of about 1 μm and a length, L, of about 1 μm.

As shown, a pulse generator 88 is used to apply a voltage pulse 89 between the piezoelectric contact leads 86, 87. A voltage source 90 is used to apply a bias between the contact 86, 87 and a current meter 91 is used to measure the current flowing through the stacked layer structure 82.

Referring in particular to FIG. 20*b*, the stacked layer structure 82 is formed on a gallium arsenide (GaAs) substrate 92 which mounted by glue 93 to the piezoelectric stressor 83. The piezoelectric stressor is formed from lead-zirconate-titanate (PZT).

The stacked layer structure 82 includes a bottom contact layer 94 comprising (non-ferromagnetic) $n^+$-GaAs, a ferromagnetic layer 95 having a relatively low coercivity (i.e. a "free" layer) comprising $Ga_{0.98}Mn_{0.02}As$ and having a thickness of 5 nm, a tunnel barrier layer 96 comprising aluminium arsenide (AlAs) having a thickness of 25 nm, a ferromagnetic layer 97 having a relatively high coercivity (i.e. a "pinned" layer) comprising $Ga_{0.98}Mn_{0.02}As$ having a thickness of 50 nm and a top contact layer 98 comprising (non-ferromagnetic) gold.

Other arrangements and other materials may be used. For example, the piezoelectric stressor 83 may be integrally formed with the substrate 92. For example, GaAs is piezoelectric along the [110] axis.

It will be appreciated that the ferromagnetic layer(s) of the fourth device 81 need not be a semiconductor but may be metallic and may comprise a material, such as ferromagnetic metals like Fe, Ni, Co or metal alloys FePt, CoPt, CoPd or another suitable transition metal/noble metal alloy.

Writing and reading cycles are similar to those shown in FIG. 12 described earlier.

A stacked layer structure need not be used. Instead, an "in-plane" transport structure, e.g. similar to that shown in FIG. 9, can be used. For example, the structure shown in FIG. 9 may be mounted on a piezoelectric stressor 83.

Figure 21:
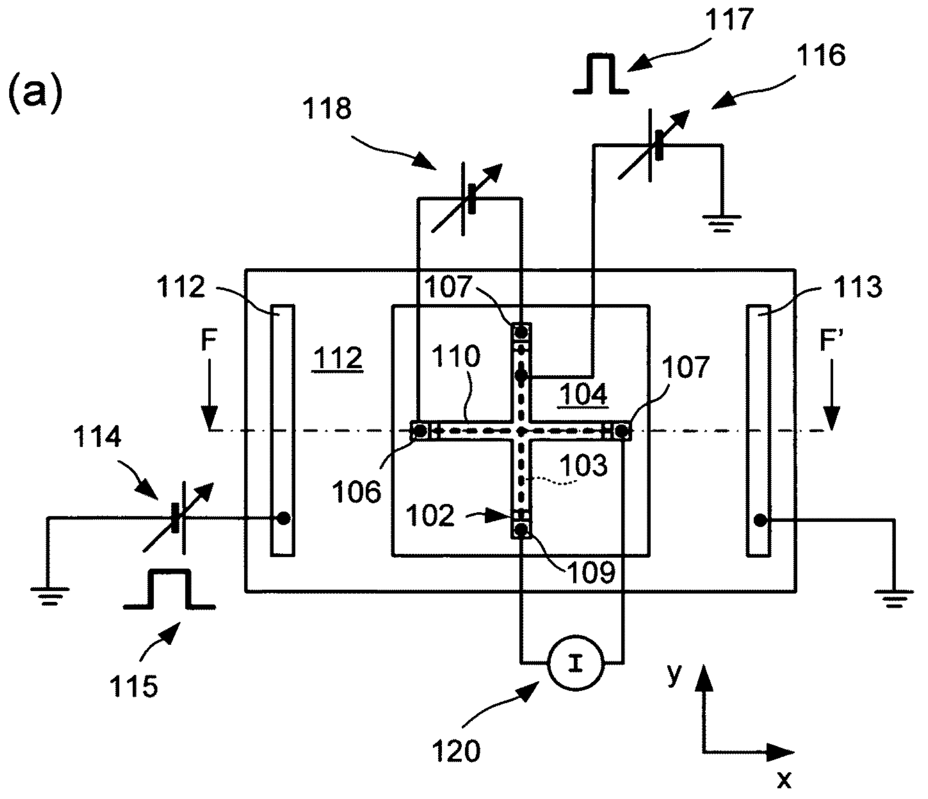
FIG. 21*a* is a plan view of a fifth device in which orientation of magnetic anisotropy in a ferromagnetic element can be varied in accordance with the present invention.
FIG. 21*b* is a cross-sectional view of a the device shown in FIG. 21*a* taken along the line F-F'.
Figure 21:
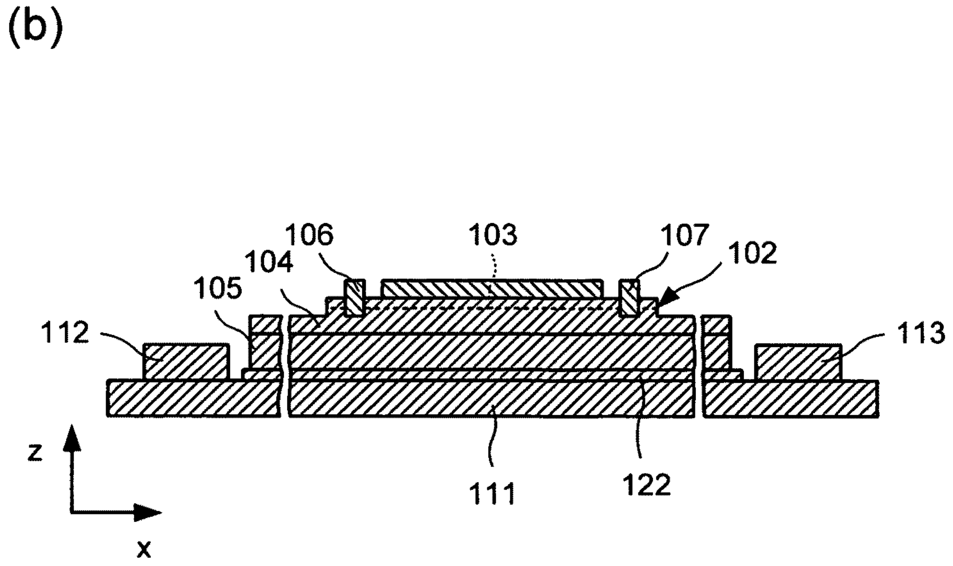

Referring to FIGS. 21*a* and 21*b*, a fifth magnetoresistive device 101 will now be described in which application of strain together with an electric pulse causes a change in magnetic anisotropy and so starts precession of magnetisation.

The device 101 comprises a cruciform mesa 102 which defines a channel 103 of ferromagnetic material, which in this case is a delta-doped layer of $Ga_{0.98}Mn_{0.02}As$ embedded in layer 104 of GaAs, and which is supported by substrate 105. First, second, third and fourth contact 106, 107, 108, 109 provide contacts to the distal ends of the channel 103 and a surface top gate 110 is used to control magnetic anisotropy. The substrate 104 is mounted on a piezoelectric layer 111 having first and second contacts 112, 113 which are used to generate an electric field within the piezoelectric layer 111 for pre-stressing the ferromagnetic channel 103.

The arms of the channel 103 each have a width of about 2 μm and a length of about 20 μm.

As shown, a first pulse generator 114 is used to apply a voltage pulse 115 between the piezoelectric contact leads 112, 113 for pre-stressing the channel 103. A second pulse generator 116 is used to apply a voltage pulse 117 to the surface gate 110 for inducing precession of magnetic anisotropy.

A voltage source 118 is used to apply a bias 119 between the first and second contact 106, 107 and a current meter 120 is used to measure the current 121 flowing between the third and fourth contacts 108, 109.

Referring in particular to FIG. 20*b*, the substrate 104 is mounted to the piezoelectric layer 111 by a layer of glue 122.

Figure 22:
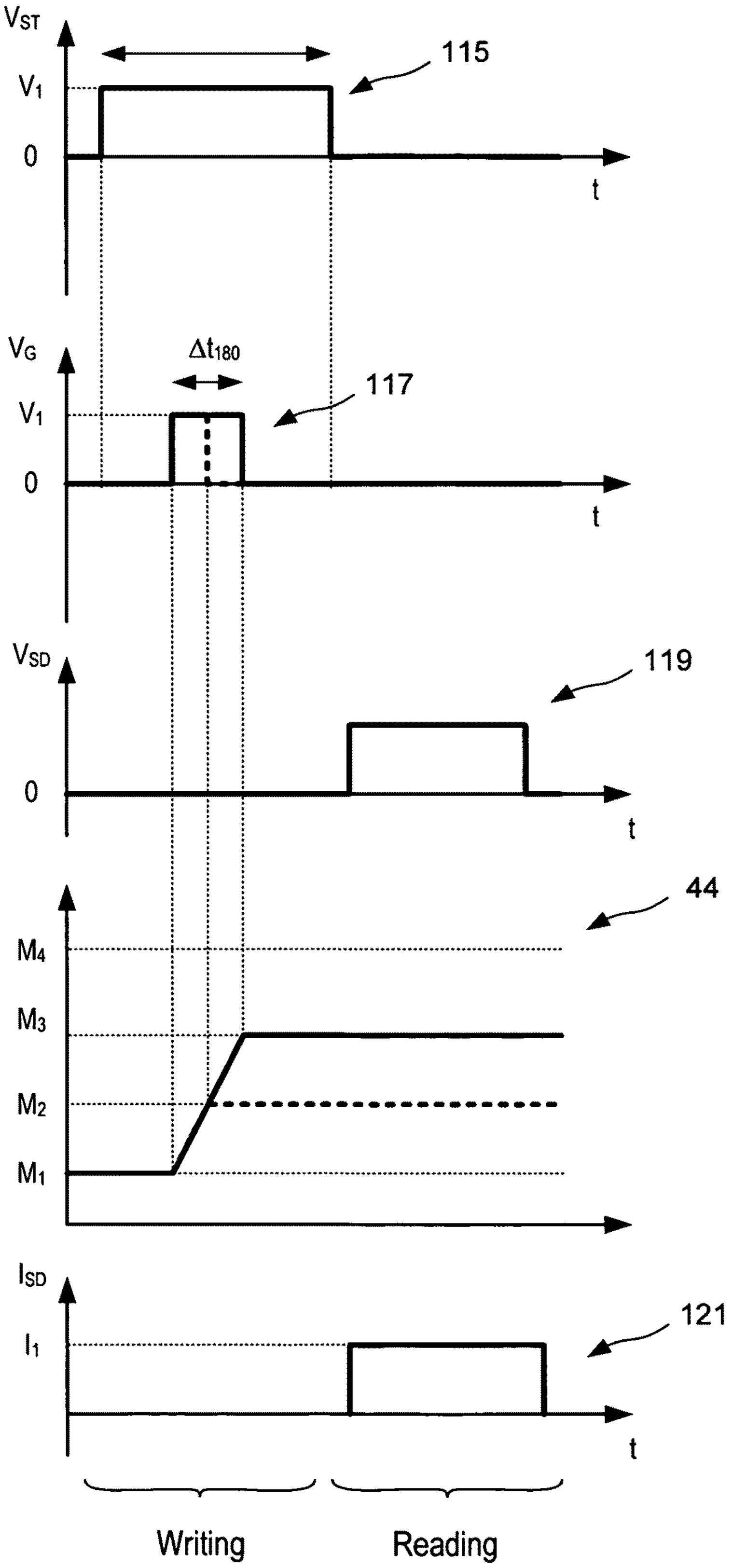
FIG. 22 illustrates writing and read cycles for the device shown in FIG. 21*a;*

Writing and reading cycles are similar to those shown in FIG. 12 described earlier. However, as shown in FIG. 22, a voltage pulse 115 is applied and during the $t_{180}$ or $t_{90}$ pulse.

In the embodiments hereinbefore described, writing and reading of data to the devices is based on treating the device as if it had only two states and, thus, store only one bit of information per device. However, taking advantage of biaxial in-plane anisotropy and uniaxial perpendicular-to-plane anisotropy, six remnant magnetisation orientations can be accessed using two types of combination of pulses and inverted pulses so as to encode more than 2 bits (i.e. In 6/ln 2≈2.6 corresponding to 6 different states).

Figure 23:
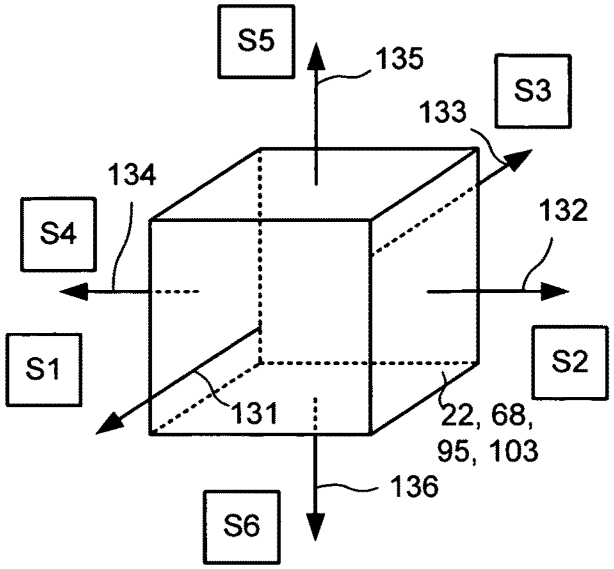
FIG. 23 illustrates a ferromagnetic element having 6 remnant magnetisation orientations.

Referring to FIG. 23, the ferromagnetic layers 22, 68, 95, 103 exhibit six remnant magnetisation orientations 131, 132, 133, 134, 135, 136.

The ferromagnetic layers 22, 68, 95, 103 can be operated in two regimes, namely a biaxial in-plane anisotropy regime in which two types of bias pulse are applied relative to a zero dc bias offset (i.e. $V_G=V_0$) and a perpendicular anisotropy regime in which an inverted bias pulse is applied, i.e. a bias pulse is applied relative to non-zero dc bias offset (i.e. $V_G=V_C$).

At $V_G=V_C$, precessional switching triggered by fast gate-voltage pulses with different pulse lengths rotate the magnetization vector between the four remnant states 131, 132, 133, 134 along the two biaxial easy axes within the layer plane.

Figure 24:
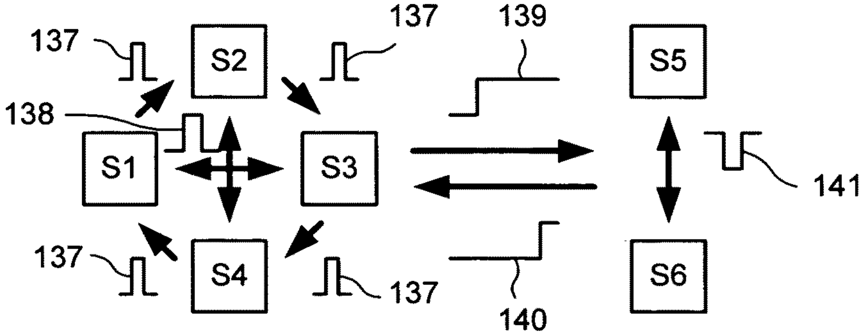
FIG. 24 illustrates switching between the remnant magnetisation orientations shown in FIG. 23 in accordance with the present invention.

Referring to FIG. 24, in one sense, an adjacent magnetisation orientation 131, 132, 133, 134 can be accessed from another of the first, second, third and fourth magnetisation orientations 131, 132, 133, 134 using a gate pulse 29, 62, 91 which effects a 90° rotation. This type of pulse is herein referred to as a "$p^{90°}$ pulse" or "$t_{90}$ pulse".

In an opposite sense, an adjacent magnetisation orientation 131, 132, 133, 134 can be accessed from another of the first, second, third and fourth magnetisation orientations 131, 132, 133, 134 using a gate pulse (not shown) which effects a 270° rotation. These pulses are hereinafter referred to as a "$p^{270°}$ pulse" or "$t_{270}$ pulse".

The first, second, third and fourth magnetisation orientations 131, 132, 133, 134 can also be accessed from a co-linear orientations 131, 132, 133, 134 using a gate pulse 138 which effects a 180° rotation, hereinafter referred to as a "$p^{180°}$ pulse" or "$t_{180}$ pulse". Thus, the first magnetisation orientation 131 can be access the third magnetisation orientation 133 using the $p^{180°}$ pulse 138.

Changing between biaxial-in-plane and uniaxial-perpendicular-to-plane anisotropy regimes is achieved by "adiabatic" magnetization reorientation which exploits dissipative damping. For example, after a gate bias has changed from $V_0$ to $V_C$, the magnetization vector M starts precessing around a modified anisotropy field $B_A(V_C)$ and dissipative damping causes the magnetization vector to spiral towards modified anisotropy field $B_A(V_C)$. The magnetization vector M eventually aligns (within thermal fluctuations) along one of the easy axes corresponding to the modified anisotropy.

Regime changes are achieved by gate bias step changes 139, 140 which are hereinafter referred to as a "$p^{damping}$ pulse" and an "inverted $p^{damping}$ pulse" respectively.

The fifth and sixth magnetisation orientations 135, 136 can be accessed by using a gate pulse 141 which effects a 180° rotation. However, the pulse 141 is inverted with respect to the $p^{180°}$ pulse 108 and is hereinafter referred to as an "inverted $p^{180°}$ pulse.

Figure 25:
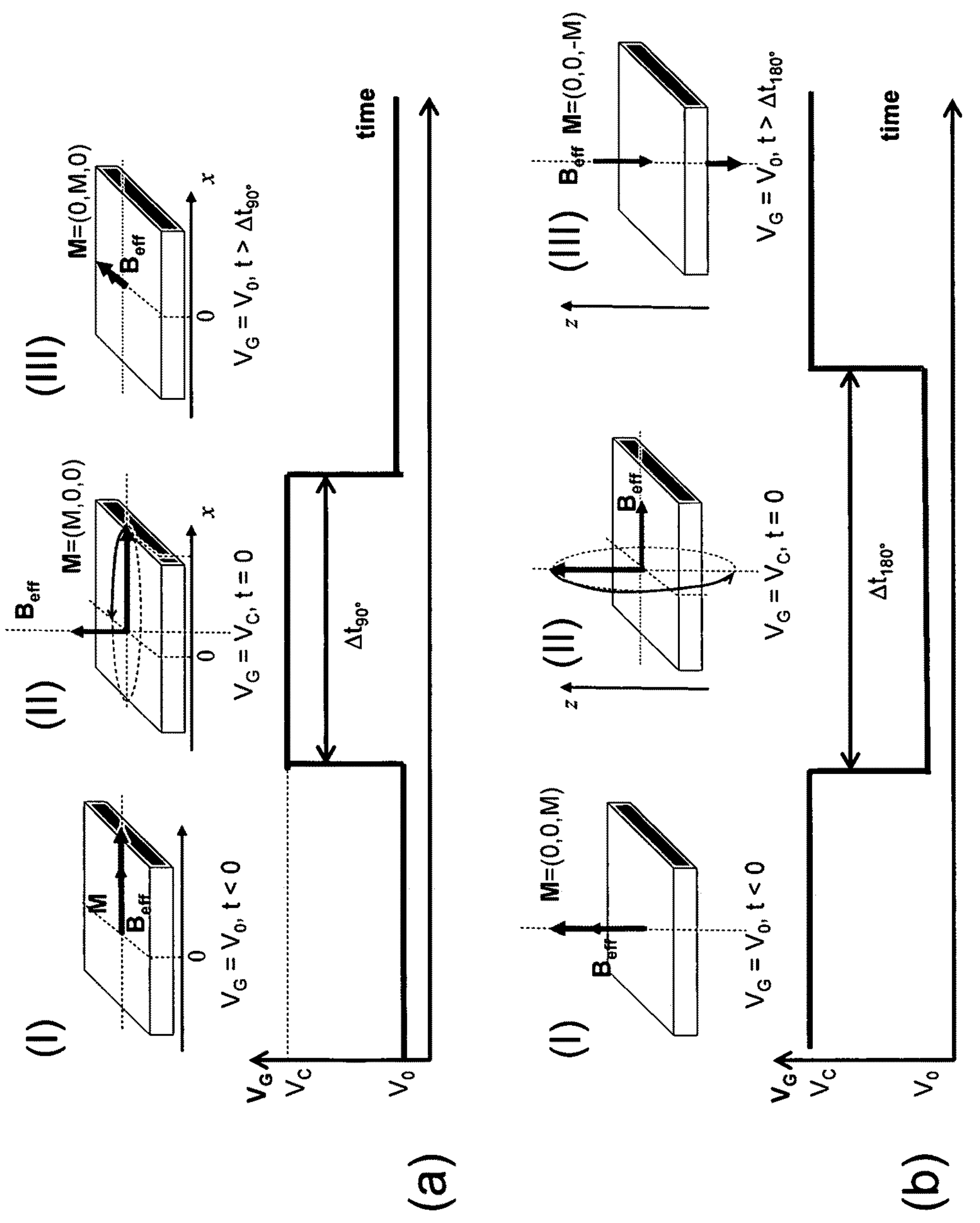
FIGS. 25*a* and 25*b* illustrate applying electric field pulses to the ferromagnetic element shown in FIG. 23 to cause a change in orientation of magnetic anisotropy and to switch magnetisation in accordance with the present invention

Referring to FIGS. 25*a* and 25*b*, the effect of applying a $p^{90°}$ pulse 137 and an inverted $p^{180°}$ pulse 141 are shown.

FIG. 25*a* illustrates precessional 90° switching in the biaxial in-plane anisotropic regime at $V_G=V_0$. As shown, the magnetic anisotropy changes from being in-plane to being perpendicular-to-the-plane during the gate voltage pulse 137 at $V_G=V_C$ and switches back to $V_0$ after the magnetization vector M has finished the 90° rotation.

FIG. 25*b* shows that an inverted pulse triggers a 180° reversal in the perpendicular-to-plane anisotropy regime.

An AHE measurement can distinguish between two uniaxial magnetization states along perpendicular-to-the-plane orientation and measurements of transverse and longitudinal AMR can unambiguously distinguish the 4 biaxial magnetization states within the plane.

Optically-Controlled Magnetoresistance Devices

In the examples hereinbefore described, magnetic anisotropy is varied electrically using a gate or using the piezoelectric effect. However, magnetic anisotropy can also be controlled optically, as will now be described in more detail.

Figure 26:
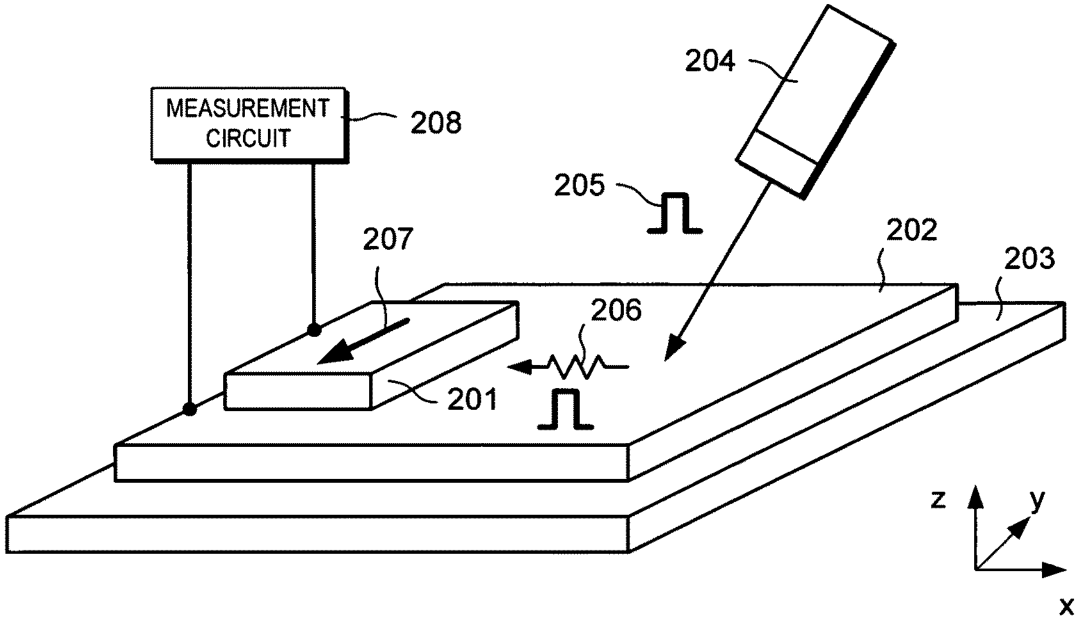
FIG. 26 is a perspective view of a device in which orientation of magnetic anisotropy in a ferromagnetic element can be varied optically.

Referring to FIG. 26, a ferromagnetic element 201 is coupled to an optically-controlled stressor 202 supported on a substrate 203. Using a photon source 204, typically in the form of a laser, a pulse of light 205 can be used to generate a phonon pulse 206 in the stressor 202. The phonon pulse 206 causes magnetisation 207 of the ferromagnetic element 201 to switch between first and second orientations, in a similar way to that described earlier.

Additional structure, such as a pinned ferromagnetic element (not shown) and a tunnel barrier layer separating the pinned ferromagnetic element and the ferromagnetic element 201 may be provided, to measure the state of the element 201 using tunnelling magnetoresistance measurement (TMR).

A measurement circuit 208, for example, comprising a voltage source and a current meter in series, can be used to measure magnetoresistance using a TMR measurement or a tunnelling anisotropic magnetoresistance (TAMR) measurement.

Figure 27:
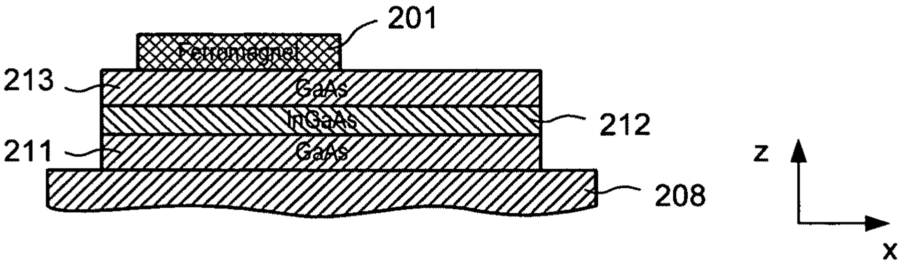
FIG. 27 is a cross sectional view of the device shown in FIG. 26.

Referring to FIG. 27, the ferromagnetic element 201 can be formed from a thin layer (e.g. about or less than 1 nm) of semiconducting material, such as GaMnAs, or from a metallic ferromagnetic material, such as Fe, Ni or Co, or alloys or multilayers, such as FePt, CoPt or CoPd. The ferromagnetic element 201 can have lateral dimensions (i.e. x- and y-directions) of the order of a few nanometers.

The stressor 202 includes a quantum well heterostructure comprising a lower GaAs layer 211, an InGaAs layer 212 and an upper GaAs layer 213 formed on a GaAs substrate 203. The concentration of In (and or Al, if used) in the InGaAs layer 212 can be chosen according the wavelength of light to be absorbed and the recombination required to generate phonon(s). The stressor 202 may have lateral dimensions of the order of a few nanometers or a few tens of nanometers. AlGaAs can be used instead of GaAs and InGaAlAs can be used instead of InGaAs.

Figure 28:
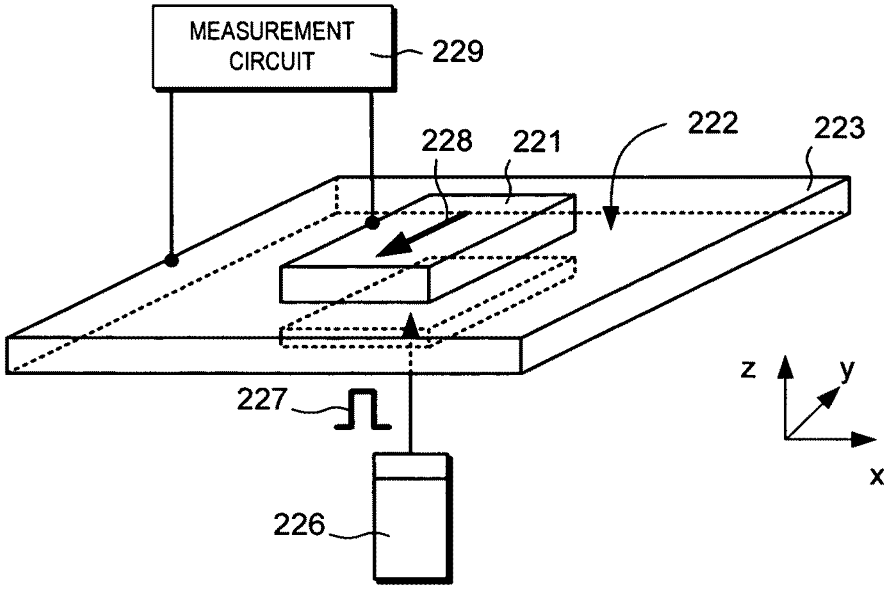
FIG. 28 is a perspective view of a device in which orientation of magnetic anisotropy in a ferromagnetic element can be varied optically.

Referring to FIG. 28, an alternative optically-controlled device is shown.

A ferromagnetic element 221 is supported on one surface 222, e.g. front side, of a substrate 223 and a stressor 224 is coupled to the substrate 223 on another surface 225, e.g. reverse side. Using a photon source 226, e.g. laser, a pulse of high intensity light 227 causes the stressor 224 to heat up and expand, thereby causing a stress pulse, i.e. phonon pulse, which is transmitted through the substrate to the ferromagnetic element 221. The phonon pulse causes magnetisation 228 of the ferromagnetic element 201 to switch between first and second orientations, in a similar way to that described earlier.

Additional structure, such as a pinned ferromagnetic element (not shown) and a tunnel barrier layer separating the pinned ferromagnetic element and the ferromagnetic element 221 may be provided, to measure the state of the element 221 using tunnelling magnetoresistance measurement (TMR).

A measurement circuit 229 can be used to measure magnetoresistance using a TMR or TAMR measurement.

Figure 29:
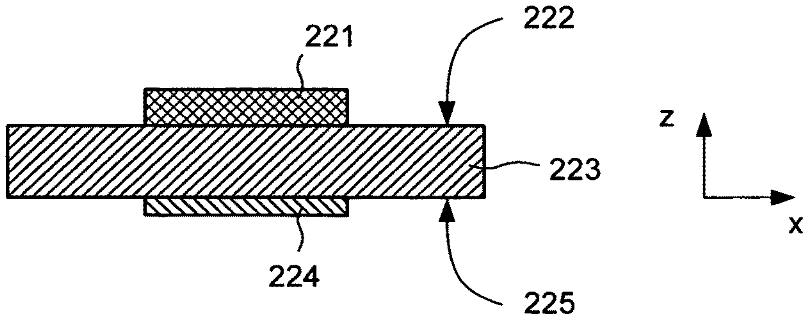
FIG. 29 is a cross sectional view of the device shown in FIG. 28.

Referring to FIG. 29, the ferromagnetic element 221 can be the same as the element 201 (FIG. 26) described earlier. The stressor 224 may comprises a pad of aluminium or other metallic material. The substrate 223 may comprise, for example, glass, silicon or GaAs. The substrate 223 can be thinned to form a membrane, e.g. a few microns thick, in a region supporting the ferromagnetic element 221 and stressor 224.

Interface Anisotropy-Controlled Magnetoresistance Devices

As explained earlier, magnetic anisotropy in a ferromagnetic element can be controlled using a gate. If the ferromagnetic element is formed of a semiconducting material, then magnetic anisotropy can be varied by controlling carrier density. However, even if the ferromagnetic element is formed of a metallic material, then magnetic anisotropy can still be varied electrically, using a gate, as will now be explained in more detail.

The (total) magnetic anisotropy is governed by a plurality of contributions including crystalline anisotropy which can depend on the Fermi energy, surface and interface anisotropy, shape anisotropy and lattice deformation magnetic anisotropy.

In some arrangements, such as in an ultrathin layer of the ferromagnetic material, the contribution due to surface and interface anisotropy can be large and can exceed the other contributions and so dominate the overall magnetic anisotropy. For example, the magnetic anisotropy of cobalt and platinum multilayers become orientated perpendicular to the plane, if the thickness of the layer of cobalt is less than 1 nm. It then becomes larger than the shape anisotropy.

Figure 30:
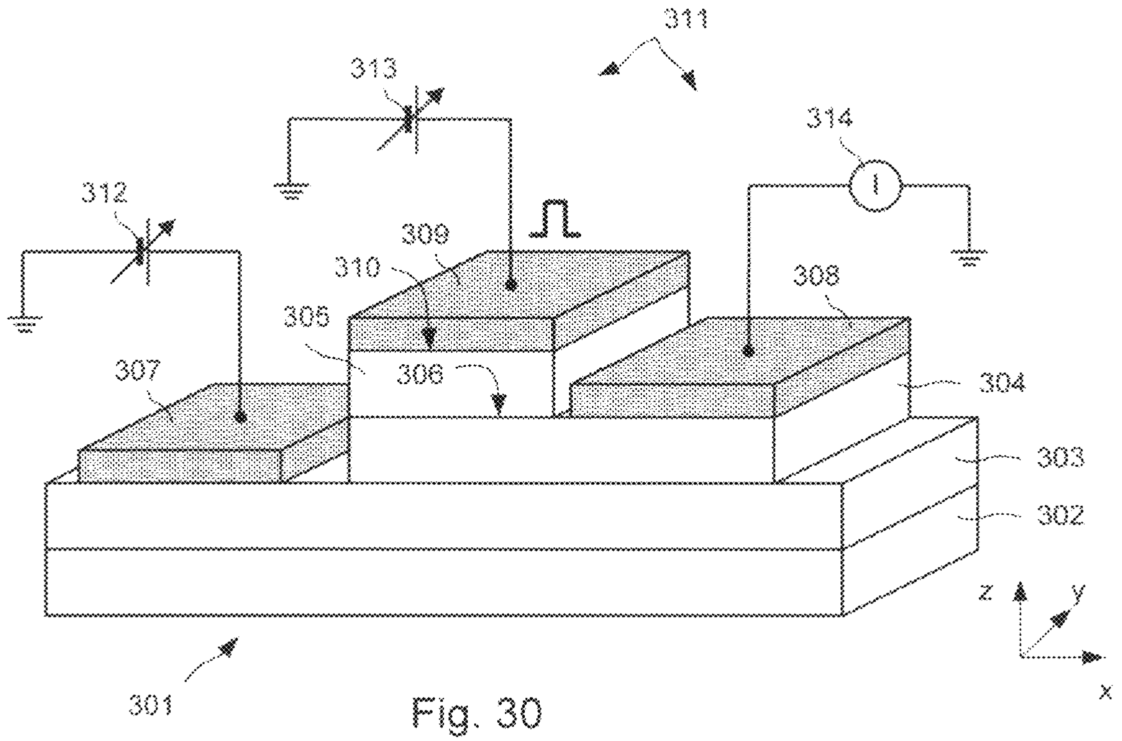
FIG. 30 is a perspective view of a device in which surface anisotropy is affected using a gate.

Referring to FIG. 30, a magnetoresistance device 301 is shown.

The device 301 is formed on an insulating substrate 302 of silicon dioxide and comprises a conductive sheet 303 and an overlying ferromagnetic multilayer structure 304. A dielectric layer 305 overlies a first portion of a top 306 of the ferromagnetic multilayer structure 304. The dielectric layer 305 comprises a material having a large value of dielectric constant (compared to silicon dioxide), such as zirconium oxide (k≈12.5) or tantalum oxide (k≈11.6).

A first electrode ("source") 307 contacts the conductive sheet 303, a second electrode ("drain") 308 contacts a second portion of the top 306 of the ferromagnetic multilayer structure 304 and a third electrode ("gate") 309 is arranged on a top 310 of the dielectric layer 305.

To allow a measurement of TMR, the second electrode 308 may comprise a ferromagnetic material, such as cobalt, having a thickness of a few nanometers.

In FIG. 30, the drain 308 and gate 309 are configured in a side-by-side arrangement. However, other arrangements, e.g. annular or interdigitated arrangements, may be used.

A measurement circuit 311 may comprise first and second voltage sources 312, 313 for applying biases, $V_S$, $V_G$, to the source electrode 307 and gate electrode 309 respectively. Source-drain current, $I_{DS}$, can be measured by a current meter 314 arranged between the drain 308 and ground.

Figure 31:
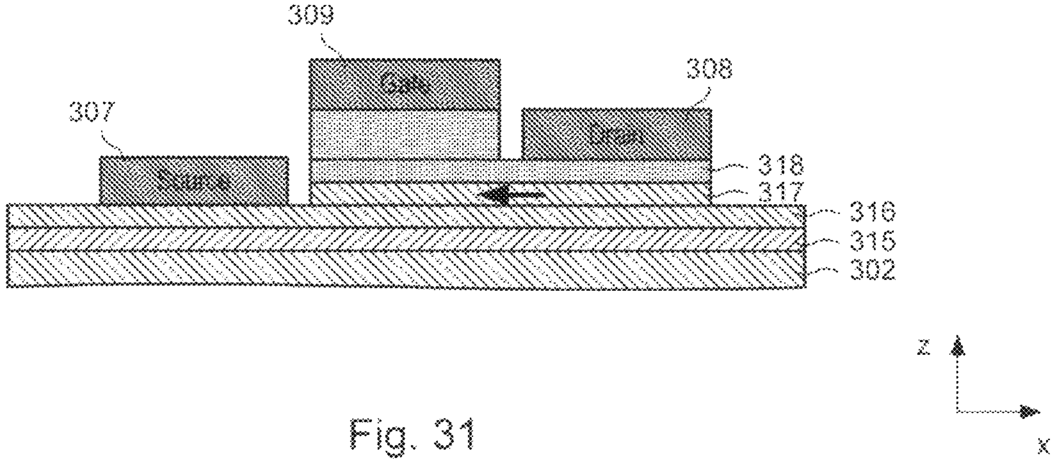
FIG. 31 is a cross sectional view of the device shown in FIG. 30.

Referring also to FIG. 31, the conductive sheet 303 comprises a layer 315 of tantalum (Ta) having a thickness of about 3 nm and an overlying layer 316 of platinum (Pt) having a thickness of about 3 nm. The layer of tantalum can help to form a smooth surface for the overlying platinum layer 316 and ferromagnetic layer structure 304.

The ferromagnetic layer structure 304 comprises an ultrathin layer 317 of cobalt (Co) having a thickness of 0.4 nm and an overlying layer 318 of aluminium oxide ($AlO_x$) having a thickness of about 1 nm.

The ferromagnetic layer structure 304 is formed by d.c. sputtering a layer of cobalt followed by a layer of aluminium about 1 nm-thick and allowing the layer of aluminium to be oxidized in dry oxygen. The structure is annealed at a temperature of about 114° C. for about 20 minutes in order to bring the anisotropy of the layer in the layer of cobalt close to a transition in magnetic anisotropy between being in-plane and perpendicular-to-plane (i.e. x-y plane) and, thus, magnetization.

An overlying layer of platinum (not shown) having a thickness of about 3 nm can also be deposited over the layer of aluminium oxide and which can be patterned to provide the drain contact 308.

An electric field, e.g. applied by the gate electrode 309 and/or the source electrode 307, can be used to trigger a change in magnetic anisotropy.

Figure 32:
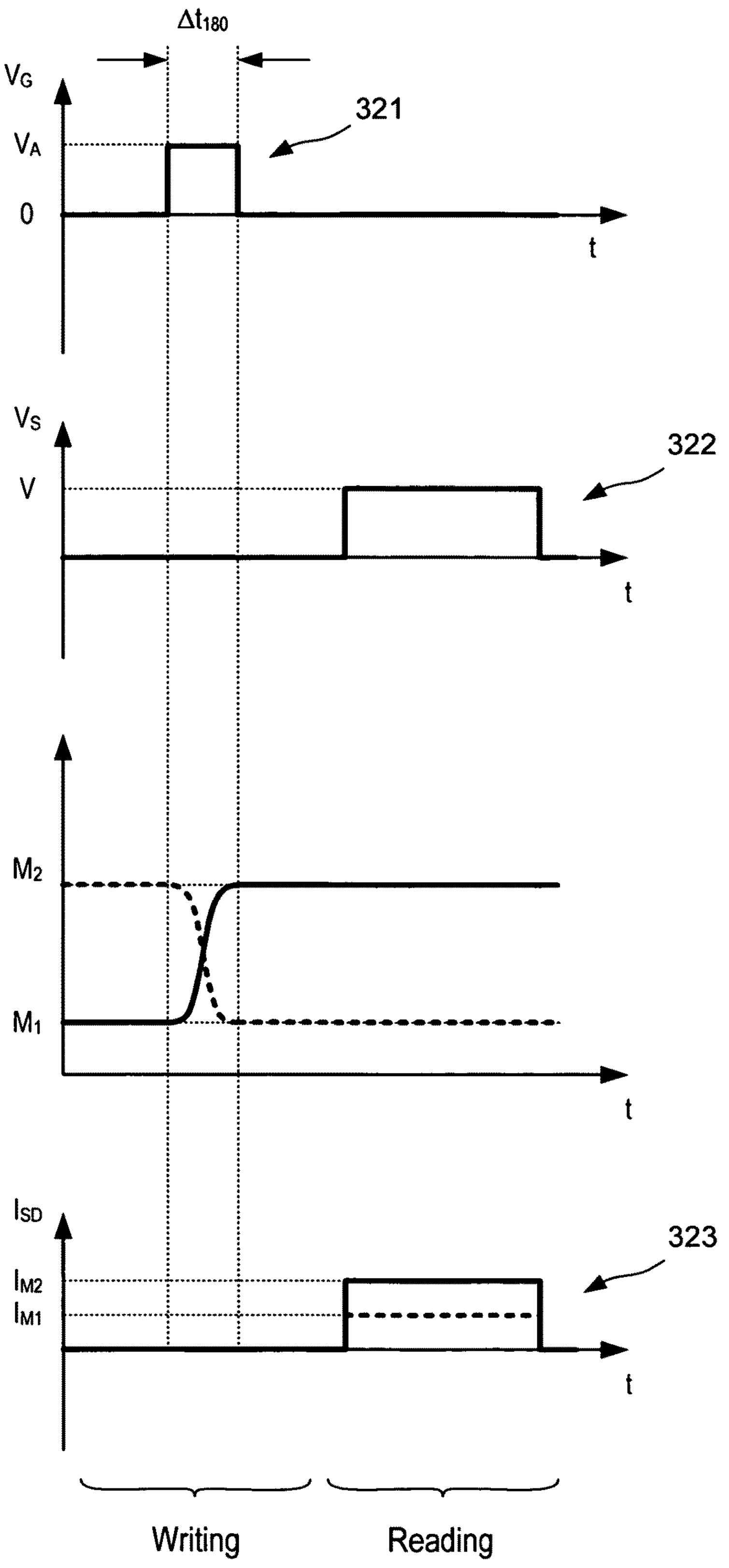
FIG. 32 illustrates writing and read cycles for the device shown in FIG. 30.

Referring also to FIG. 32, a set of writing and reading cycles for the device 301 is shown for toggling the device 301 between states.

To write data, a positive voltage pulse 321 is applied to the gate electrode 309. Concurrently, the source electrode 307 is grounded and the drain electrode 308 is allowed to float.

The pulse 321 has sufficient magnitude, e.g. to produce an electric field of the order $10^6$ or $10^7$ V/cm. The pulse 321 has a duration, $t_{180}$, which is half of the precession period, $t_{precss}$, which can be calculated using equation (6) earlier.

To read data, the gate electrode 309 is grounded or allowed to float while a positive voltage pulse, $V_m$, is applied to the source electrode 307 relative to the drain electrode 308 (which may be grounded).

The source-drain current, $I_{SD}$, 323 is measured and reflects the state of the device, i.e. direction magnetization, e.g. which may be in-plane or perpendicular to plane.

The device 301 can operate at higher temperatures, e.g. up to or at room temperature, for example if the Currie temperature is greater than the operating temperature, e.g. room temperature, and if anisotropy density energy times the volume of the element (k×V) is greater than 50 $k_B$T, where $k_B$ is Boltzmann's constant and T is operating temperature in Kelvin. Introducing transition metals, such as platinum (Pt), palladium (Pd) or iridium (Ir), as an alloyed interfacial layer or as thin, polarisable layer, e.g. one or two monolayers thick, can enhance interface and surface anisotropy and, thus, increase the operating temperature.

Figure 33:
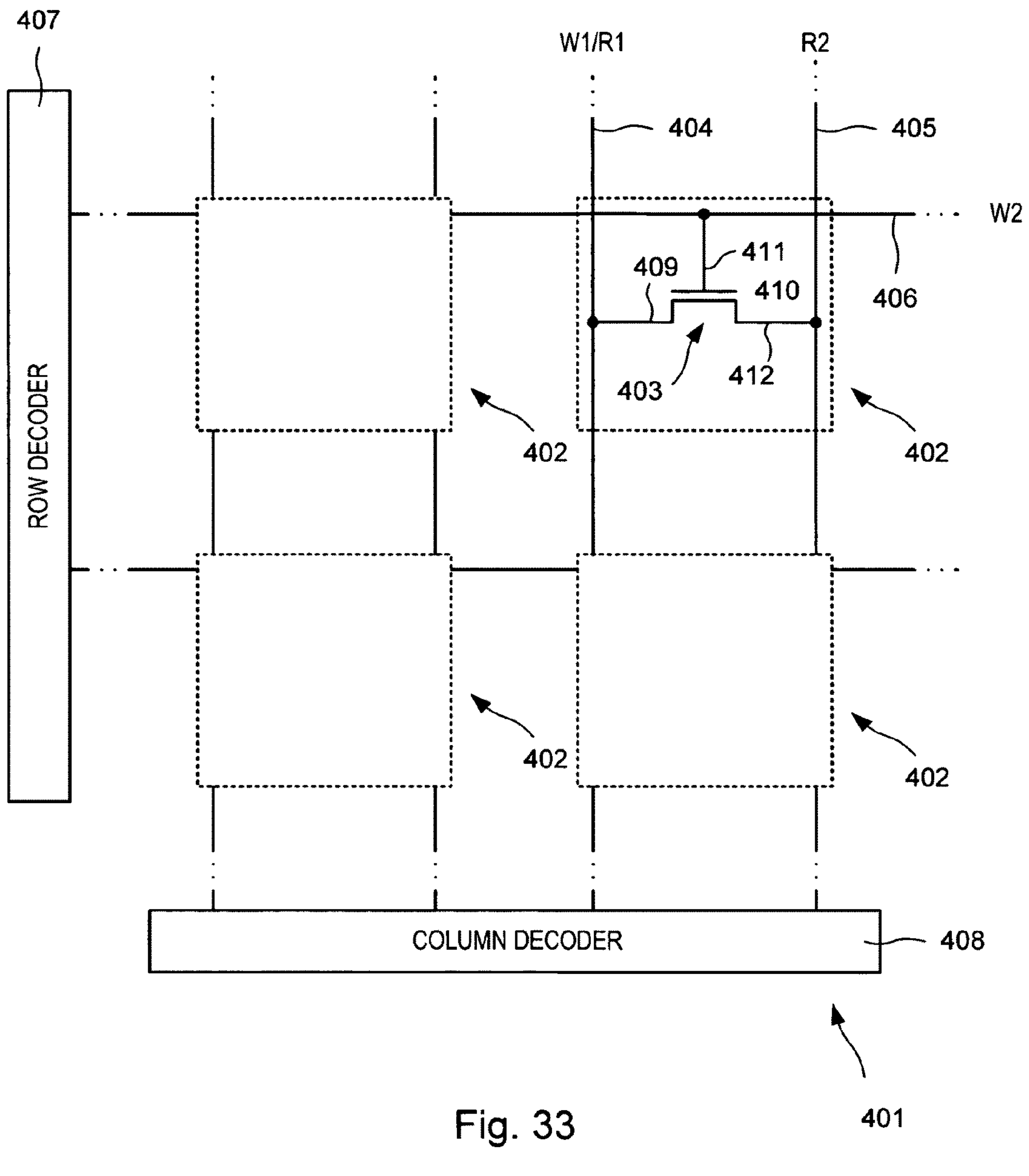
FIG. 33 illustrates a memory array.

Referring to FIG. 33, a magnetoresistance device in accordance with the present invention, for example device $21_1$ (FIG. 8*a*) or device 301 (FIG. 30) can serve as the basis of a memory element in a memory array 401. In the following, the memory array 401 is described based on the device 301 shown in FIG. 30.

The memory array 401 includes an array of cells 402 each including a magnetoresistance device 403. The cells 402 can be selected and data written to or read from the cell 403 via first, second and third lines 404, 405, 406 driven by row and column decoders 407, 408.

The device 403 has source, drain and gate electrodes 409, 410, 411.

Figure 34:
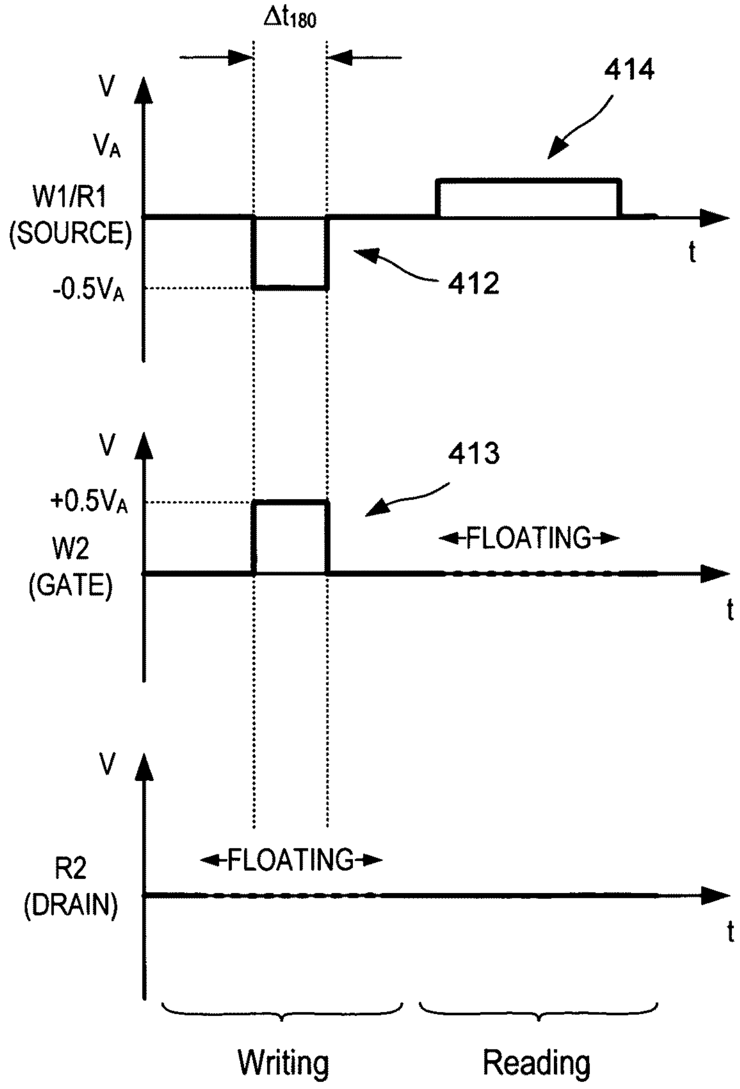
FIG. 34 illustrates writing and read cycles for the memory array shown in FIG. 33.

Referring also to FIG. 34, a set of writing and reading cycles for a memory cell 402 is shown.

To write data, a negative voltage pulse 412 is applied the first line 404 and, concurrently, a positive voltage pulse 413 is applied to the third line 406 so as to select and write data to a selected cell 402. The second line 405 is allowed to float.

The magnitude of each pulse 412, 413 is such that a pulse 412, 413 is insufficient to trigger a change in magnetic anisotropy by itself. However, together the pulses generate a larger field which is able to trigger the change. Thus, the magnitude of each pulse is about $0.5V_A$. The pulses 412, 413 each have a duration, $t_{180}$, which is half of the precession period, $t_{precss}$.

To read data, a positive voltage pulse 414 is applied the first line 404, while the third line 406 (i.e. gate) is allowed to float and second line 405 (i.e. drain) is grounded. Current flow can be measured through the first and second lines 404, 405 and, thus, measure the state of the cell.

Figure 35:
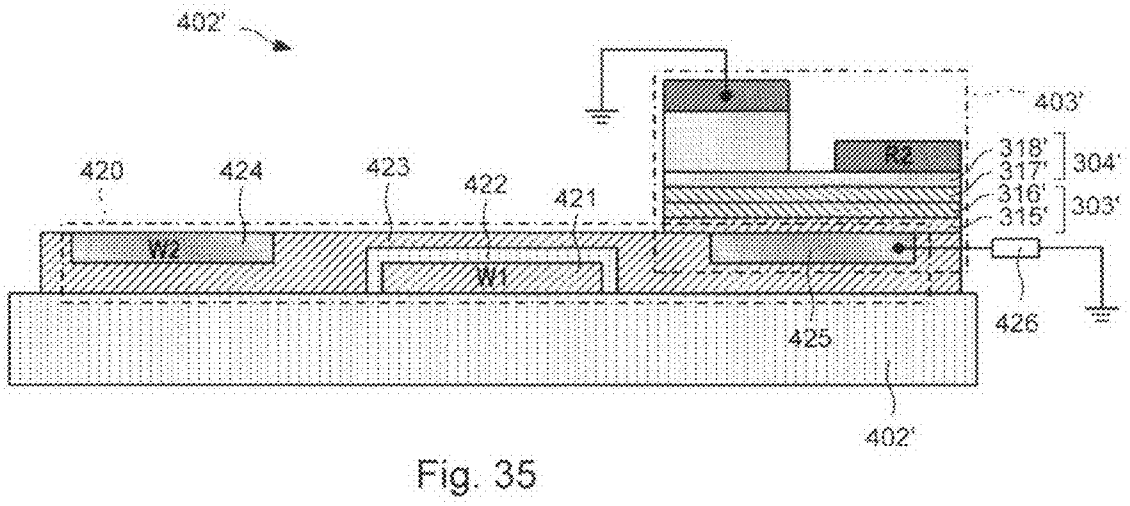
FIG. 35 illustrates a memory cell for use in the memory array shown in FIG. 33.
Figure 36:
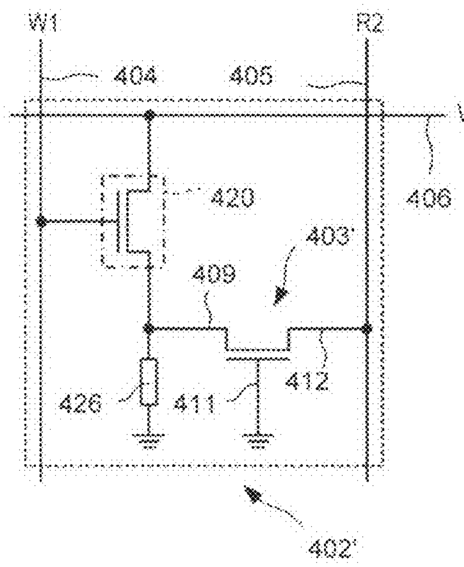
FIG. 36 is a circuit corresponding to the memory cell shown in FIG. 35.

Referring to FIGS. 35 and 36, an alternative memory cell 402' is shown. The cell 402' is similar to the cell 402 described earlier based on the device 301 shown in FIG. 30. However, the cell 402' includes a field effect transistor 420 and so can be addressed in a different manner.

As shown in FIG. 35, the cell 402' is formed on an insulating substrate 302'. The substrate 402' supports a gate electrode 421 isolated by a gate dielectric 422 from an overlying conductive channel 423. The gate electrode 421 comprises highly-doped, n-type silicon ($n^+$-Si), the gate dielectric 422 comprises silicon dioxide and the conductive channel 423 comprises, for example, undoped or lightly doped, p-type silicon ($p^-$-Si). Highly-doped, n-type wells provide source and drain electrodes 424, 425 for the field effect transistor 420. The drain electrode 425 (or end of the channel) is connected to ground via a resistor 426. This may be achieved using a ground plane provided in the substrate or an additional line or strip. The conductive base layers 303' and ferromagnetic layer structure 304' are formed on the drain electrode 425 in the same way as described earlier. It will be appreciated that other semiconducting materials, including organic semiconducting materials, can be used.

Figure 37:
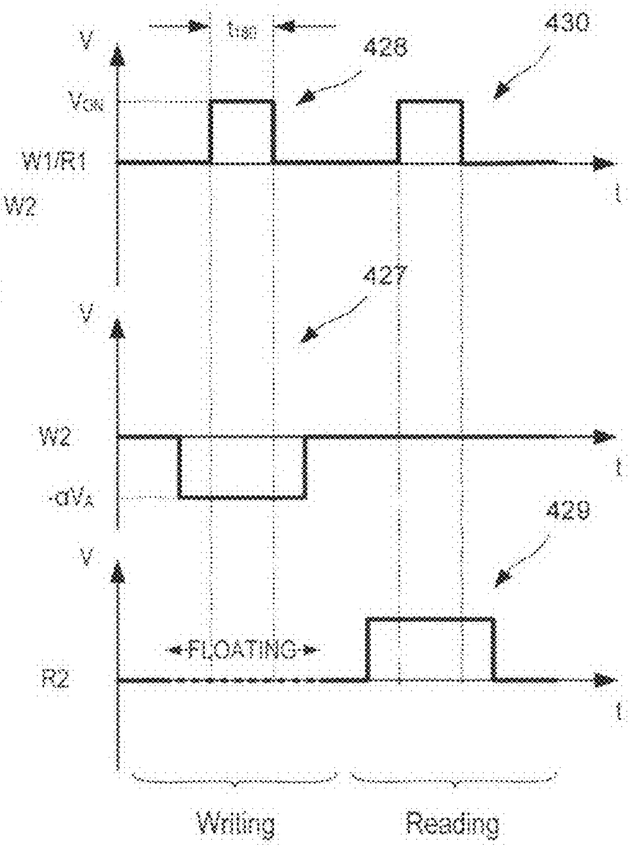
FIG. 37 illustrates modified writing and read cycles for a memory array using the cell shown in FIG. 35.

Referring also to FIG. 37, a set of writing and reading cycles for a memory cell 402' is shown.

To write data, a first negative voltage pulse 427 is applied to the third line 406 and, concurrently, a second positive voltage pulse 428 is applied to the first line 404 so as to select and write data to a selected cell 402'. The second line 405 and, thus, the drain of the magnetoresistance device 308, is allowed to float.

The magnitude of first voltage pulse 427 is about $\alpha V_A$ ($\alpha$>1 and such that the drain is at $V_A$) and has a duration of a duration, $t_{180}$, which is half of the precession period, $t_{precss}$.

To read data, a positive voltage pulse 429 is applied the second line 405 (i.e. to magnetoresistance device drain). The first line 404 and, thus, the source 424 of the FET 420 is held low, e.g. at ground. The FET 420 is then turned on to allow conduction through the FET 420 and through the magnetoresistance device 403'.

Gate-Dependent Exchange-Coupling

In the examples hereinbefore described, re-orientation of magnetization is triggered by a change in magnetic anisotropy and can be electrically controlled, for example, using a gate. However, re-orientation of magnetization can also be achieved through exchange coupling and which can also be electrically controlled, for example, using a gate. This will now be described in more detail.

Exchange coupling is the interaction between localized magnetic moments of atoms, mediated by spin of the conduction electrons. This effect is employed in TMR and GMR devices to couple adjacent ferromagnetic (FM) layers in a ferro- or antiferro-magnetic arrangement. For example, exchange coupling can be used to pin a ferromagnetic layer with respect to a free layer as in a synthetic antiferromagnet (SAF).

Bias interlayer exchange coupling (IEC), which is usually simply referred to as "exchange bias", between adjacent ferromagnetic layers can be considered to act like an additional field.

Figure 38:
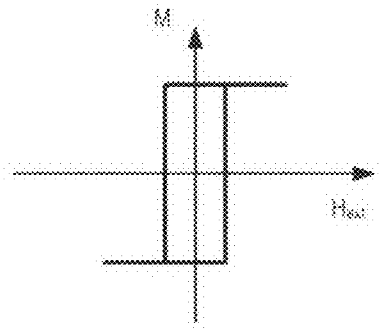
FIGS. 38 and 39 illustrate magnetization loops for a ferromagnetic element with and without interlayer exchange coupling.
Figure 39:
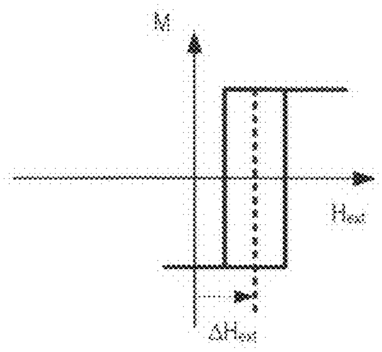

Referring to FIGS. 38 and 39, a magnetization loop for a "free" ferromagnet and a magnetization loop for the "free" ferromagnet when exchanged coupled to another ferromagnet to form a synthetic antiferromagnet are shown respectively. As shown in FIGS. 38 and 39, exchange coupling has the effect of shifting the magnetization loop for the "free" layer along the field axis, $H_{ext}$.

Figure 40:
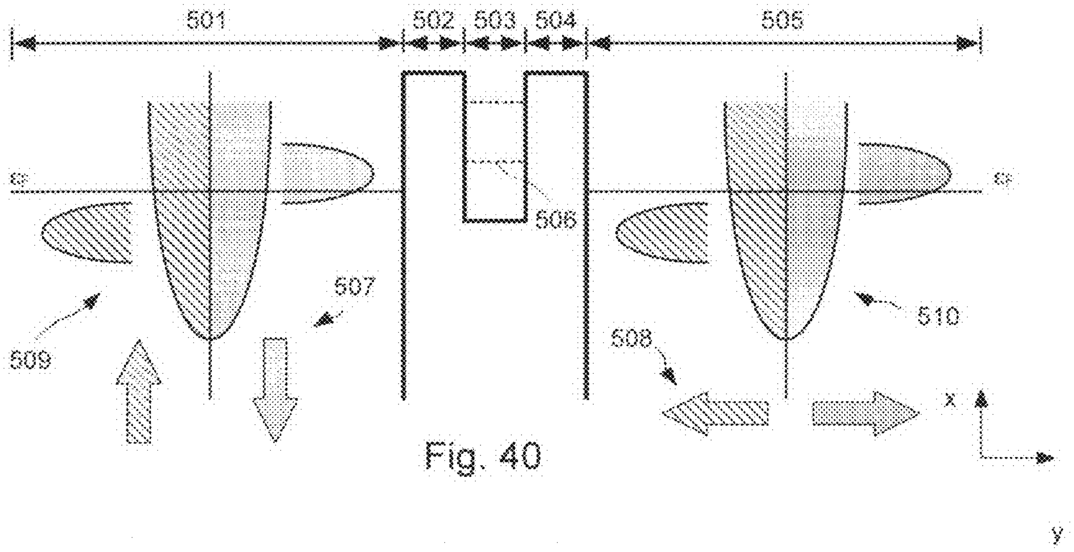
FIG. 40 illustrates two ferromagnetic layers separated by a quantum well structure at zero bias.

Referring to FIG. 40, a band diagram of a device which uses exchange coupling to switch magnetization in response to an applied bias is shown.

The device includes a first ferromagnetic electrode 501, a first tunnel barrier layer 502, a quantum well layer 503, a second tunnel barrier 504 and a second ferromagnetic electrode 505. The tunnel barrier layers 502, 504 and quantum well layer 503 define a double barrier structure having a quantum well which includes one or more resonant state(s) 506. The first ferromagnetic electrode 501 has an easy axis along an x-direction with fixed magnetization orientation 507. The second ferromagnetic electrode 505 has an easy axis along y-direction with fixed magnetization orientation 508. Densities of states 509, 510 for the ferromagnetic electrodes 501, 505 are shown schematically. At zero bias, the double barrier is off-resonance and exchange interaction is suppressed.

The first ferromagnetic electrode 501 may have, for example, in-plane magnetic anisotropy with pinned magnetization orientation, e.g. using a synthetic antiferromagnet (not shown). The second ferromagnetic electrode 505 may have, for example, perpendicular-to-plane magnetic anisotropy due to, for example, choice of layer thickness and/or surface/interface anisotropies.

Figure 41:
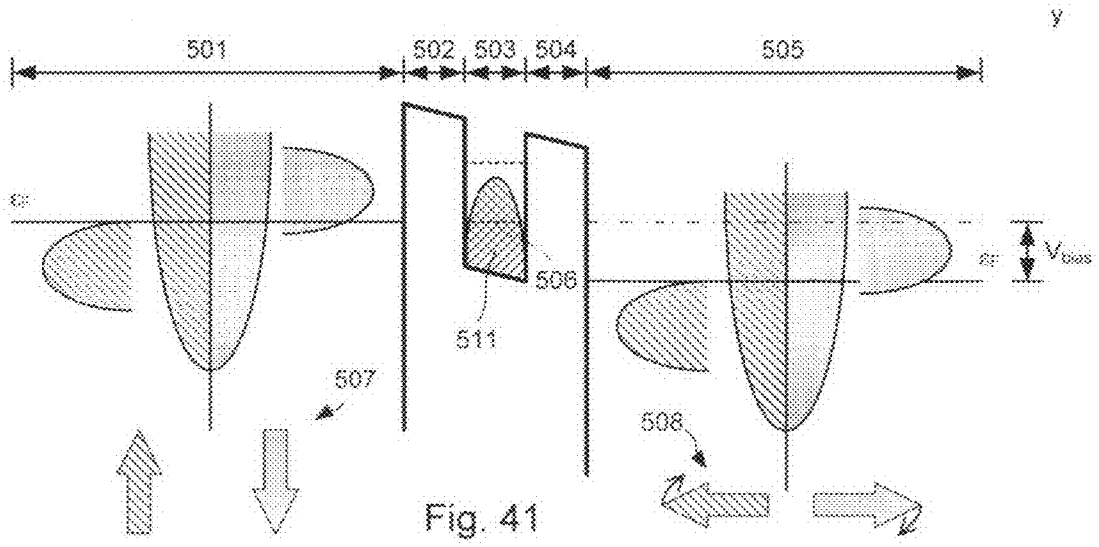
FIG. 41 illustrates two ferromagnetic layers separated by a quantum well structure when in resonance.

Referring to FIG. 41, applying a bias voltage between the first and second ferromagnetic electrodes 501, 505 shifts the energies of the resonant states with respect to the Fermi energies of the ferromagnetic electrodes 501, 505 so that a state 506 is brought into resonance and the transmission probability between electrons with an energy $\in_F^{FM1}$ becomes very high so that the interlayer interaction becomes large.

In this way, exchange torque along z-orientation acts on the magnetization 508 of the second ferromagnetic electrode 505. This exchange torque may be used to cause precession of the magnetization 508 or to support precession in addition to an external magnetic field which is oriented along the first magnetization 507 and perpendicular to the second magnetization 508.

An arrangement which uses bias-controlled exchange torque can have the advantage of allowing magnetization to be switched using a small applied voltage, for example of about a few volts.

Figure 42:
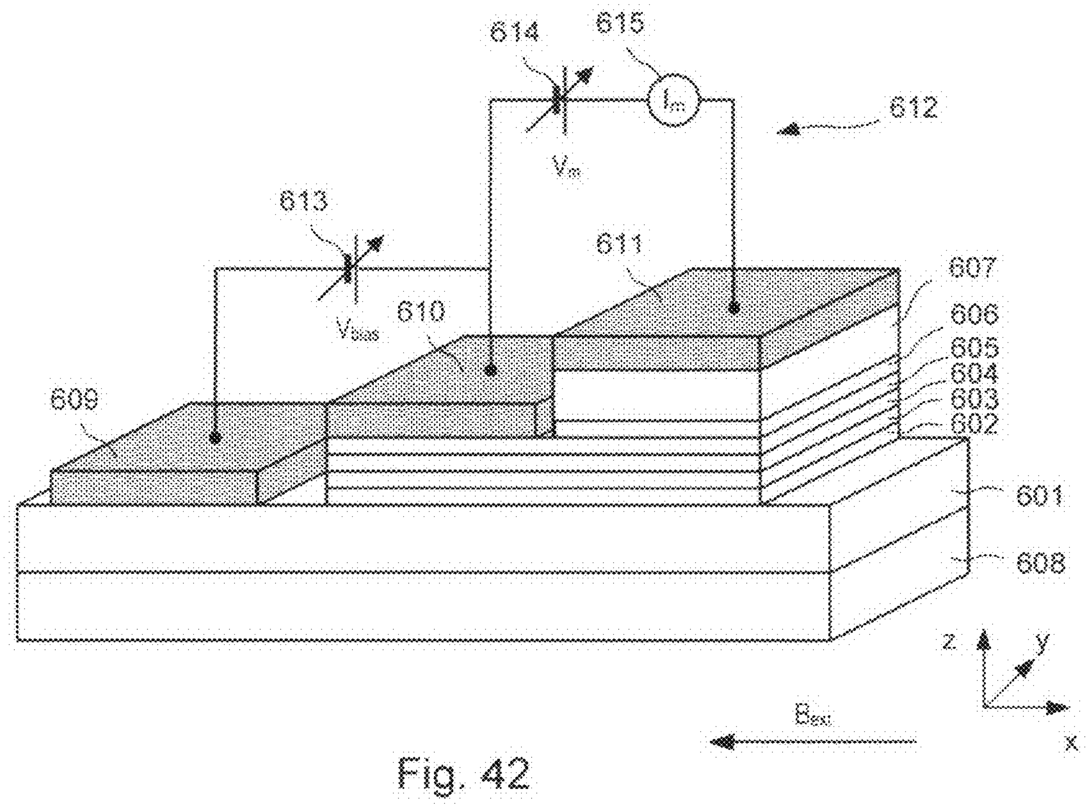
FIG. 42 is a perspective view of a device in which exchange coupling is used to switch magnetisation.

Referring to FIG. 42, a device is shown which uses bias-controlled exchange torque to switch magnetization.

The device comprises a stacked structure which includes a first ferromagnetic layer 601, a first tunnel barrier layer 602, a quantum well layer 603, a second tunnel barrier 604, a second ferromagnetic layer 605, a third barrier 606 and third ferromagnetic layer 607.

The first and third ferromagnetic layers 601, 607 are pinned with in-plane and perpendicular-to-plane anisotropy, respectively. The second ferromagnetic layer 605 is free and in has an easy magnetization axis which is perpendicular to the plane. This layer 605 is exchange coupled to the first ferromagnetic layer 601 when an energy of the quantum well equal the Fermi level of the first ferromagnetic layer 601 at $V_{bias}=V_{res}$.

The stacked structure is arranged on an insulating substrate 608 and is stepped so as to allow contacts 609, 610, 611 to each of the ferromagnetic layers 601, 605, 607.

The ferromagnetic layers 601, 605, 607 may comprise cobalt. The second ferromagnetic layer 605 can be made thin, e.g. <1 nm, and may have an overlying layer of platinum, as described earlier.

The tunnel barrier layers and the quantum well layer may be formed from AlGaAs and GaAs respectively or other similar systems.

A circuit 612 for controlling a measuring the device includes a first voltage source 613 for applying a bias voltage between the first and second ferromagnetic layers 601, 605 and a second voltage source 614 for applying a measurement voltage between the second and third ferromagnetic layers 605, 607. A current meter 615 is used to measure current.

Magnetizations 616, 617, 618 of the ferromagnetic layers 601, 605, 607 are shown.

The two possible equilibrium orientations of the magnetization 617 of the second magnetization layer 605 can be detected by a resistance TMR measurement between the second and third ferromagnetic layers 605, 607.

Applying a constant field $B_{ext}$ parallel to the magnetization orientation of first magnetization layer 601 can support precession of magnetisation 617 in the second ferromagnetic later during a short $V_{bias}$-pulse is applied. However, no precession takes place if only $B_{ext}$ is applied due to the damped character of the precession.

Figure 44:
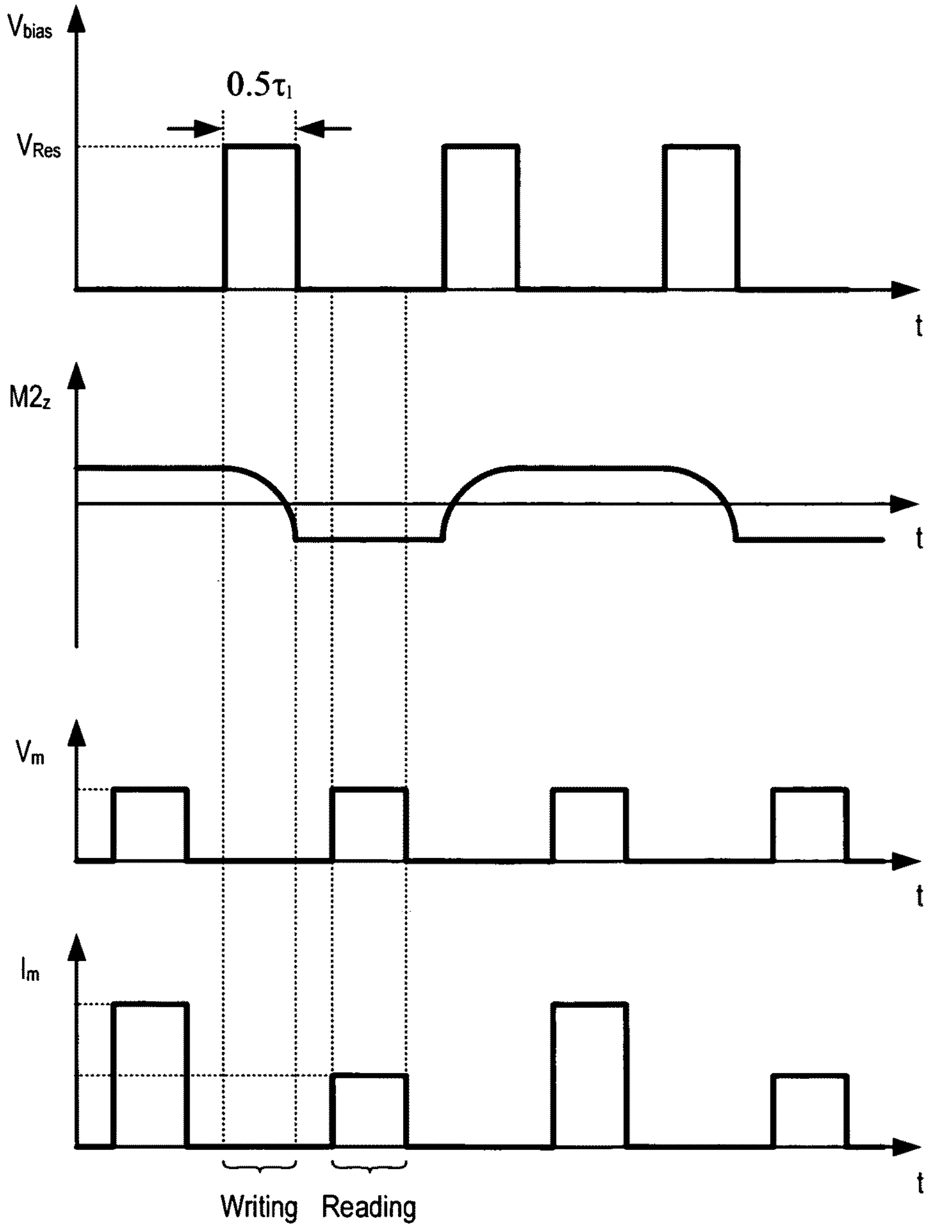
FIG. 44 is perspective view of another device in which exchange coupling is used to switch magnetisation.

Referring to FIG. 44, operation of the device is shown in more detail.

Applying pulses at $V_{bias}$ with magnitude $V_{res}$ for a duration of half of the Lamor precession time as shown in equation (6) above of the magnetization 617 toggle-switches between (non-volatile) states, "$M_2$" and "$-M_2$".

The read-out involves a TMR measurement between the second and third ferromagnetic layers 605, 607.

Figure 43:
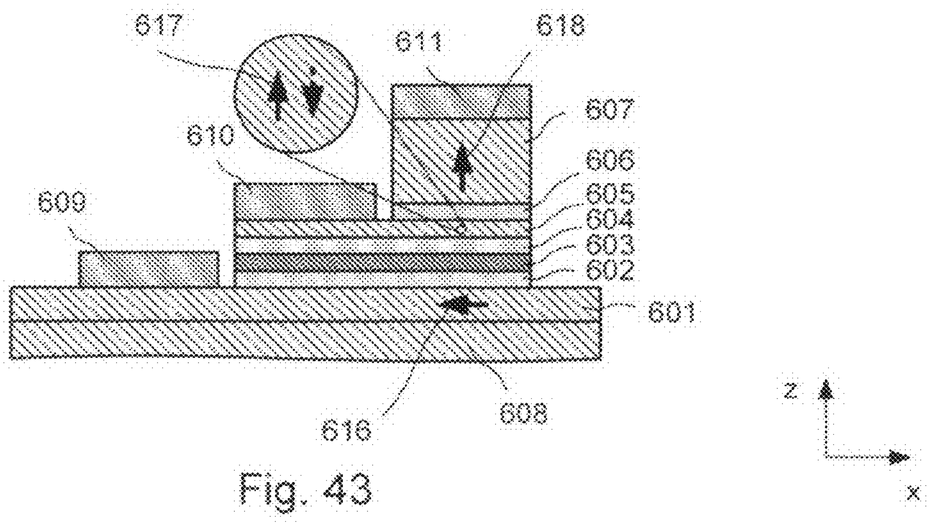
FIG. 43 is a cross sectional view of the device shown in FIG. 42.
Figure 45:
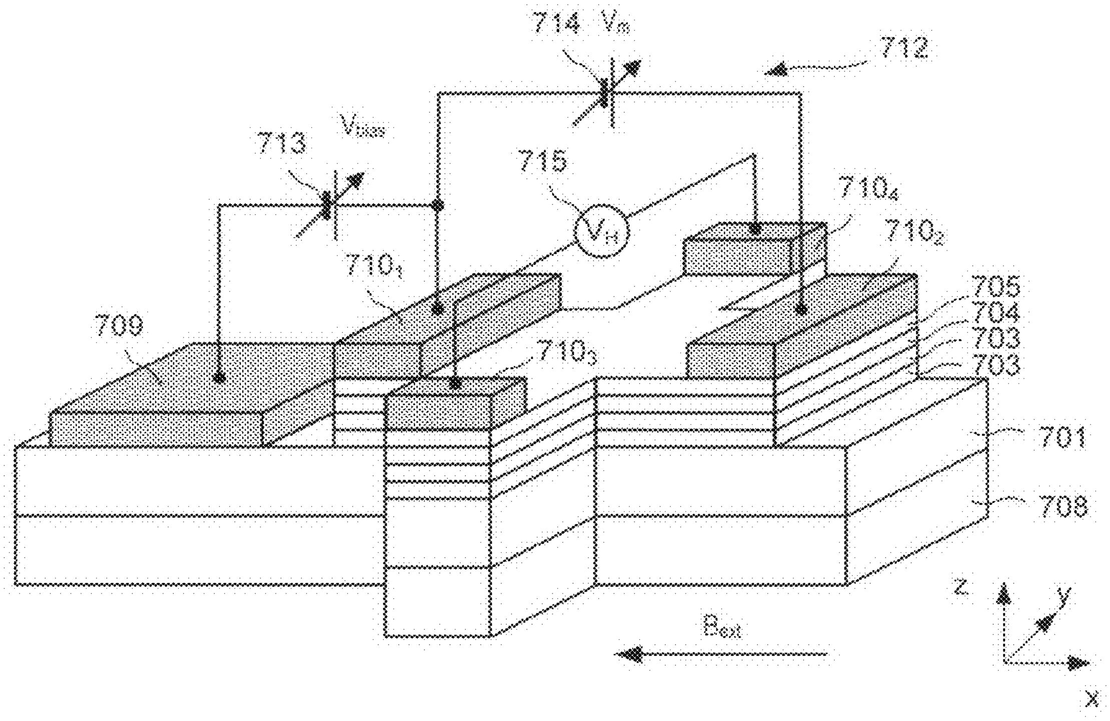
FIG. 45 is a cross sectional view of the device shown in FIG. 43.
Figure 46:
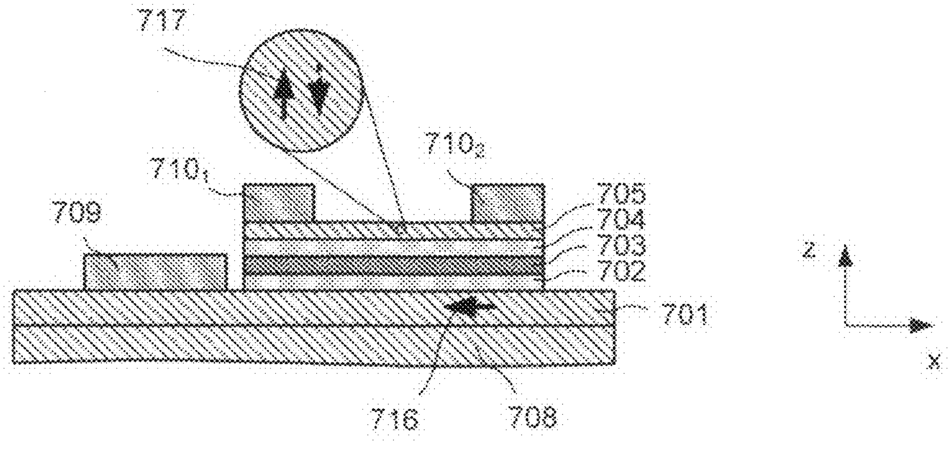

Referring to FIGS. 45 and 46, another device is shown which uses bias-controlled exchange torque to switch magnetization. The device is simpler to fabricate than the device shown in FIGS. 42 and 43 in that it has fewer layers in particular the third ferromagnetic layer can be omitted. The device is measured using the Anomalous Hall effect (AHE).

The device comprises a stacked structure which includes a first ferromagnetic layer 701, a first tunnel barrier layer 702, a quantum well layer 703, a second tunnel barrier 704 and a second ferromagnetic layer 705.

The first ferromagnetic layer 70 is pinned with in-plane anisotropy. The second ferromagnetic layer 705 is free and in has an easy magnetization axis which is perpendicular to the plane. This layer 705 is exchange coupled to the first ferromagnetic layer 701 when an energy of the quantum well equal the Fermi level of the first ferromagnetic layer 60 at $V_{bias}=V_{res}$.

The stacked structure is arranged on an insulating substrate 708 and is stepped so as to allow contacts 709, $\mathbf{710_1}$, $\mathbf{710_2}$, $\mathbf{710_3}$, $\mathbf{710_4}$ to the ferromagnetic layers 601, 605.

The device is patterned to form a Hall bar provided with end contacts $\mathbf{710_1}$, $\mathbf{710_2}$ and transverse contacts $\mathbf{710_3}$, $\mathbf{710_4}$ to the second ferromagnetic layer 705.

A circuit 712 for controlling a measuring the device includes a first voltage source 713 for applying a bias voltage between the first and second ferromagnetic layers 701, 705 and a second voltage source 714 for applying a measurement voltage between the end contacts $\mathbf{710_1}$, $\mathbf{710_2}$. A voltage meter 715 is used to measure Hall voltage between the lateral contacts $\mathbf{710_3}$, $\mathbf{710_4}$.

The Hall signal may be measured between two opposite transverse contacts as shown or it can be measured using only one transverse contact against common ground.

The Hall Voltage signal changes polarity if the magnetisation 717 of the changes from $+M_{2z}$ to $-M_{2z}$.

It will be appreciated that many modifications may be made to the embodiments hereinbefore described. For example, the ferromagnetic layer may have a different thickness, for example between 5 and 20 nm. Devices may operate based on electron or hole transfer. A capping layer may be used to protect the GaMnAs layer. The magnetoresistive device can have a multiple layer structure, such as a magnetic tunnel junction or spin valve. Memory devices may comprise an array of magnetoresistance devices which are controlled electrically, e.g. by applying an electric field pulse to the ferromagnetic material or to a piezoelectric stressor, or optically can be used.

The invention claimed is:

1. A memory device comprising:

an array of memory cells, each cell including a magnetoresistive device comprising a ferromagnetic region, configured to exhibit magnetic anisotropy and to allow magnetization thereof to be switched between at least first and second orientations, and a gate, wherein the gate is configured to be operable to cause a change of orientation of the magnetic anisotropy of the ferromagnetic region through capacitive coupling to the ferromagnetic region; and row and column decoders, wherein the row and column decoders include circuitry for applying an electric field pulse to a ferromagnetic region of a magnetoresistive device in a memory cell using the gate to cause orientation of magnetic anisotropy to change for switching magnetization between the first and second orientations, wherein the electric field pulse has a duration, t, which is an integer multiple of a quarter of a precession period $t_{precess}$ of the magnetization such that the electric field pulse triggers precessional switching of the magnetization of the ferromagnetic region between the first and second orientations.

2. A memory device comprising:

an array of memory cells, each cell including a magnetoresistive device comprising a ferromagnetic region configured to exhibit magnetic anisotropy and to allow magnetization thereof to be switched between at least first and second orientations and means for applying stress to the ferromagnetic region in response to an electrical input; and means for supplying an input pulse to the stress-applying means in a memory cell so as to cause orientation of magnetic anisotropy of a corresponding ferromagnetic region to change for switching magnetization between the first and second orientations, wherein the input pulse has a duration, t, which is an integer multiple of a quarter of a precession period $t_{precess}$ of the magnetization such that the input field pulse triggers precessional switching of the magnetization of the ferromagnetic region between the first and second orientations.

3. A device according to claim 2, wherein the input pulse supplying means comprises circuitry for applying an electrical input pulse, the ferromagnetic region is piezoelectric and the stress-applying means comprises at least one electrode configured to apply an electric field to the ferromagnetic region.

4. A device according to claim 2, wherein the input supplying means comprises circuitry for applying an electrical input pulse and the stress-applying means comprises a piezoelectric region coupled to the ferromagnetic region and at least one gate electrode configured to apply an electric field to the piezoelectric region.

5. A device comprising:

first and second electrodes, a ferromagnetic region and a single tunnel barrier between the first and second electrodes, the electrodes, the ferromagnetic region and the tunnel barrier arranged such that charge transport between the first and second electrodes occurs through the ferromagnetic region and the tunnel barrier, the device further comprising:

a third electrode and a dielectric region disposed between the third electrode and the tunnel barrier, the third electrode and the dielectric region arranged so as to apply an electric field to the ferromagnetic region and wherein application of an electric field pulse to the ferromagnetic region causes orientation of magnetic anisotropy to change for switching magnetization of the ferromagnetic region between the first and second orientations, wherein the electric field pulse has a duration, t, which is an integer multiple of a quarter of a precession period $t_{precess}$ of the magnetization such that the electric field pulse triggers precessional switching of the magnetization of the ferromagnetic region between the first and second orientations.

6. A device comprising:

first and second electrodes, a ferromagnetic region and a tunnel barrier, the electrodes, the ferromagnetic region and the tunnel barrier arranged such that charge transport between the first and second electrodes occurs through the ferromagnetic region and the tunnel barrier, the device further comprising:

a third electrode and a dielectric region disposed between the third electrode and the tunnel barrier, the third electrode and the dielectric region arranged so as to apply an electric field to the ferromagnetic region and wherein application of an electric field pulse to the ferromagnetic region causes orientation of magnetic anisotropy to change for switching magnetization of the ferromagnetic region between the first and second orientations, wherein the tunnel barrier is arranged as a layer having first and second faces and wherein the second electrode and the dielectric region are arranged adjacently on one of the faces, and wherein the electric field pulse has a duration, t, which is an integer multiple of a quarter of a precession period $t_{precess}$ of the magnetization such that the electric field pulse triggers precessional switching of the magnetization of the ferromagnetic region between the first and second orientations.

7. A device comprising:

first and second electrodes, a ferromagnetic region and a single tunnel barrier between the first and second electrodes, the electrodes, the ferromagnetic region and the tunnel barrier arranged such that charge transport between the first and second electrodes occurs through the ferromagnetic region and the tunnel barrier, the device further comprising:

a third electrode and a dielectric region disposed between the third electrode and the tunnel barrier, the third electrode and the dielectric region arranged so as to apply an electric field to the ferromagnetic region and wherein application of an electric field pulse to the ferromagnetic region causes orientation of magnetic anisotropy to change for switching magnetization of the ferromagnetic region between the first and second orientations, wherein the ferromagnetic region is arranged as a layer in a plane and is configured such that an anisotropy field of the ferromagnetic region is switchable between being in plane and perpendicular, and wherein the electric field pulse has a duration, t, which is an integer multiple of a quarter of a precession period $t_{precess}$ of the magnetization such that the electric field pulse triggers precessional switching of the magnetization of the ferromagnetic region between the first and second orientations.

* * * * *